(12) United States Patent
Cho et al.

(10) Patent No.: US 12,191,432 B2
(45) Date of Patent: Jan. 7, 2025

(54) LIGHT EMITTING DIODE DISPLAY DEVICE

(71) Applicant: LG Display Co., Ltd., Seoul (KR)

(72) Inventors: Seongyong Cho, Paju-si (KR); Hoon Kang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/359,814

(22) Filed: Jul. 26, 2023

(65) Prior Publication Data
US 2024/0204151 A1  Jun. 20, 2024

(30) Foreign Application Priority Data

Dec. 19, 2022  (KR) .................. 10-2022-0177897

(51) Int. Cl.
*H01L 33/60* (2010.01)
*G02B 5/02* (2006.01)
*H01L 25/16* (2023.01)

(52) U.S. Cl.
CPC ............ *H01L 33/60* (2013.01); *G02B 5/0236* (2013.01); *G02B 5/0278* (2013.01); *H01L 25/167* (2013.01); *H01L 2933/0091* (2013.01)

(58) Field of Classification Search
CPC .................. H01L 33/60; H01L 25/167; H01L 2933/0091; G02B 5/0236; G02B 5/0278; G02F 2201/343; H01K 59/50
See application file for complete search history.

(56) References Cited

U.S. PATENT DOCUMENTS

| 5,532,854 A | * | 7/1996 | Fergason | ............... G02F 1/1393 |
| | | | | 349/200 |
| 2012/0194749 A1 | * | 8/2012 | Kimura | .................... G09G 3/36 |
| | | | | 348/800 |
| 2019/0198583 A1 | * | 6/2019 | Han | ...................... G02B 5/3083 |
| 2019/0212700 A1 | * | 7/2019 | An | .......................... G02B 13/18 |

FOREIGN PATENT DOCUMENTS

| KR | 10-2019-0083880 A | 7/2019 |
| KR | 10-2019-0116448 A | 10/2019 |
| KR | 10-2020-0077019 A | 6/2020 |

* cited by examiner

*Primary Examiner* — Nathanael R Briggs
(74) *Attorney, Agent, or Firm* — Seed IP Law Group LLP

(57) ABSTRACT

Disclosed is a light emitting diode display device comprising a light emitting diode over a substrate, and an optical element provided with liquid crystal molecule randomly distributed therein and configured to change a path of light emitted from the light emitting diode.

17 Claims, 10 Drawing Sheets

LIGHT EMITTING DIODE DISPLAY DEVICE

CROSS-REFERENCE TO RELATED APPLICATION(S)

This application claims the benefit and priority to Korean Application No. 10-2022-0177897, filed Dec. 19, 2022, the entirety of which is hereby incorporated by reference.

BACKGROUND

Technical Field

The present disclosure relates to a display device, and more particularly, to a light emitting diode display device.

Description of the Related Art

A display device is widely used as a display screen of a laptop computer, a tablet computer, a smart phone, a portable display device, and a portable information device in addition to a display screen of a television or a monitor. A liquid crystal display device and an organic light emitting display device display an image by the use of thin film transistor serving as a switching element. As the liquid crystal display device has a backlight unit, there is a limitation in design, and luminance and response speed may be reduced. Since the organic light emitting display device includes an organic material, the organic light emitting display device is vulnerable to moisture, whereby reliability and lifespan thereof may be deteriorated.

Recently, research and development of a light emitting diode display device using a micro light emitting diode has been conducted, and the light emitting diode display device has high quality and high reliability, whereby it is spotlighted as a next generation display device.

A related art light emitting diode display device may have a luminance distribution of 'M' shape in which light generated from a light emitting diode has a maximum luminance at a viewing angle greater than 0°. The luminance distribution of 'M' shape has a problem that the luminance at the front side (0°) is low, whereby it may have an inefficient luminance at the front side.

BRIEF SUMMARY

The present disclosure provides a light emitting diode display device capable of improving a front luminance.

The present disclosure provides a light emitting diode display device capable of preventing non-uniformity of luminance by preventing a front luminance from being reduced in an occurrence of a transfer tolerance.

The present disclosure provides a light emitting diode display device capable of improving a light extraction efficiency.

In accordance with an aspect of the present disclosure, a light emitting diode display device is provided, which includes a light emitting diode provided on a substrate, and an optical element provided with liquid crystal molecule randomly distributed therein and configured to change a path of light emitted from the light emitting diode.

In accordance with another aspect of the present disclosure, a light emitting diode display device is provided, which includes: a light emitting diode over a substrate; an upper optical element provided with liquid crystal molecule randomly distributed therein and provided over the light emitting diode; a lower optical element provided with liquid crystal molecule randomly distributed therein and provided between the substrate and the light emitting diode, wherein light emitted downward from the light emitting diode is reflected or scattered by the lower optical element and has a changed light path in an upward direction, wherein light emitted upward from the light emitting diode and the light reflected or scattered by the lower optical element and proceeding upwardly are scattered while being transmitted through the upper optical element.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
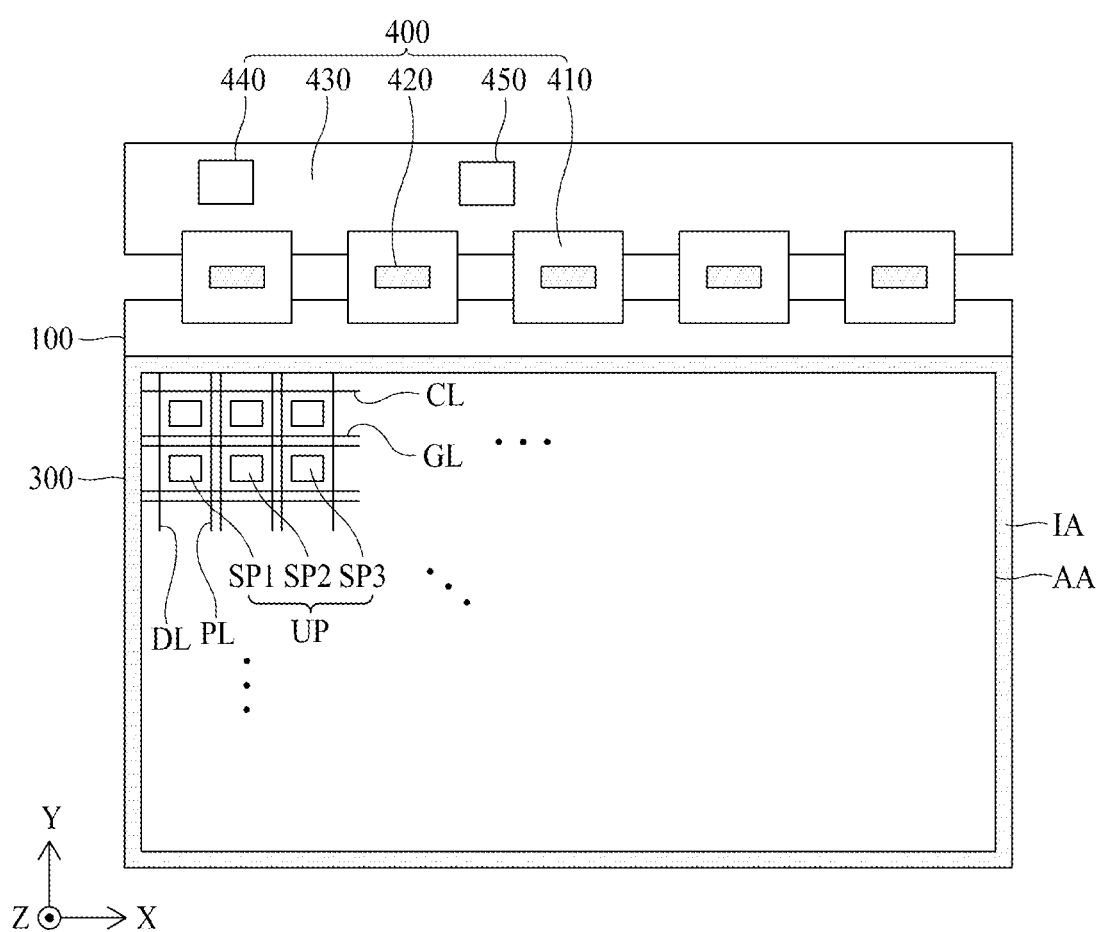
FIG. 1 is a plan view schematically illustrating a light emitting diode display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a dimension (e.g., length, width, height, thickness, radius, diameter, area, etc.), a ratio, an angle, and a number of elements disclosed in the drawings for describing embodiments of the present disclosure are merely an example, and thus, the present disclosure is not limited to the illustrated details.

A dimension including size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a plan view schematically illustrating a light emitting diode display device according to one embodiment of the present disclosure.

Hereinafter, for example, X axis indicates a line parallel with a gate line, Y axis indicates a line parallel with a data line, and Z axis indicates a height direction of a light emitting diode display device.

Referring to FIG. 1, the light emitting diode display device according to one embodiment of the present disclosure includes a first substrate 100, a plurality of unit pixels UP, and a second substrate 300.

The first substrate 100 is a thin film transistor array substrate and may include glass or a plastic material. The first substrate 100 may be divided into a display area AA and a non-display area IA.

The non-display area IA is an area in which an image is not displayed, and the non-display area IA corresponds to an area excluding the display area AA. The non-display area AA is an edge area of the first substrate 100 surrounding the display area AA, wherein the non-display area AA may have a relatively narrow width, and may be referred to as a bezel area. A wiring and a circuit for driving the plurality of unit pixels UP in the display area AA may be disposed in the non-display area IA.

The display area AA is an area in which the plurality of unit pixels UP are provided to display an image, and the display area AA corresponds to the remaining area except for the edge area of the first substrate 100.

The plurality of unit pixels UP are provided in the display area AA. The plurality of unit pixels UP may be arranged in such a way that each of the plurality of unit pixels UP has a first reference pixel distance preset along a first direction (e.g., X-axis direction) and has a second reference pixel distance preset along a second direction (e.g., Y-axis direction) in the display area AA. Herein, the first reference pixel distance may be referred to as a distance between the centers of two adjacent unit pixels UP along the first direction (e.g., X-axis direction), and the second reference pixel distance may be referred to as a distance between the centers of two adjacent unit pixels along the second direction (e.g., Y-axis direction).

Each of the plurality of unit pixels UP may include a plurality of subpixels SP1, SP2, and SP3. For example, each of the plurality of unit pixels UP may include a red subpixel S1 configured to emit red light, a green subpixel SP2 configured to emit green light, and a blue subpixel SP3 configured to emit blue light. In another example, each of the plurality of unit pixels UP may include a white subpixel configured to emit white light.

The first substrate 100 may be provided with pixel driving lines together with the plurality of unit pixels UP in the display area AA.

The pixel driving lines are provided on a front surface of the first substrate 100 and configured to supply signals required for each of the plurality of subpixels SP1, SP2, and SP3. According to one embodiment, the pixel driving lines may include a plurality of gate lines GL, a plurality of data lines DL, a plurality of driving power lines PL, and a plurality of common power lines CL.

The plurality of gate lines GL may extend in the first direction (e.g., X-axis direction) on the front surface of the first substrate 100 and may be spaced apart from each other in the second direction (e.g., Y-axis direction). Each of the plurality of gate lines GL may supply a scan signal to the plurality of subpixels SP1, SP2, and SP3.

The plurality of data lines DL may be disposed to intersect the plurality of gate lines GL on the front surface of the first substrate 100. The plurality of data lines DL may extend in the second direction (e.g., Y-axis direction) and may be spaced apart from each other in the first direction (e.g., X-axis direction). Each of the plurality of data lines DL may supply a data voltage to the plurality of subpixels SP1, SP2, and SP3.

The plurality of driving power lines PL may be arranged in parallel with the plurality of data lines DL on the front surface of the first substrate 100. Each of the plurality of driving power lines PL may supply a pixel driving power provided from the outside to the adjacent subpixels SP1, SP2, and SP3.

The plurality of common power lines CL may be arranged in parallel with each of the plurality of gate lines GL on the front surface of the first substrate 100. Each of the plurality of common power lines CL may supply common power provided from the outside to the adjacent subpixels SP1, SP2, and SP3.

Each of the subpixels SP1, SP2, and SP3 is provided in a subpixel area coupled to the gate line GL and the data line DL. Each of the plurality of subpixels SP1 to SP3 may be referred to as a minimum unit area in which light is emitted virtually.

According to one embodiment, the light emitting diode display device may further include a scan driver and a panel driver 400.

The scan driver generates a scan pulse according to a gate control signal inputted from the panel driver 400 and supplies the scan pulse to the gate line GL. The scan driver may be provided in the non-display area at the left and/or right side of the display area AA or may be provided in the display area AA. The scan driver may be provided in the arbitrary non-display area IA or display area AA capable of supplying the scan pulse to the gate line GL. The scan driver may be formed by a gate driver in panel GIP method, a gate driver in active area GIA method, or a tape automated bonding TAB method.

The panel driver 400 is connected to a pad portion prepared in the non-display area IA of the first substrate 100 and is configured to display an image corresponding to image data supplied from a host system on the display area AA. The panel driver 400 according to one embodiment may include a plurality of data flexible circuit films 410, a plurality of data driving integrated circuits 420, a printed circuit board 430, a timing controller 440, and a power supply circuit 450.

Each of the plurality of data flexible circuit films 410 may be attached to the pad portion of the first substrate 100 by a film attaching process. Each of the plurality of data driving integrated circuits 420 may be individually mounted on each of the plurality of data flexible circuit films 420. The data driving integrated circuit 420 receives pixel data and a data control signal provided from the timing controller 440, converts the pixel data into a data voltage for each pixel in an analog form according to the data control signal, and supplies the data voltage to the corresponding data line DL.

The timing controller 440 is mounted on the printed circuit board 430 and receives image data and a timing synchronization signal provided from the host system. The timing controller 440 generates pixel data by aligning image data to be suitable for a pixel arrangement structure of the display area AA based on the timing synchronization signal, and provides the generated pixel data to the data driving integrated circuit 420. In addition, the timing controller 440 may generate each of a data control signal and a gate control signal based on the timing synchronization signal to control the driving timing of each of the plurality of data driving integrated circuits 420 and the scan driver.

The power supply circuit 450 is mounted on the printed circuit board 430 and generates various voltages for displaying an image in the display area AA by using an input power input from the outside and supplies the generated voltages to a corresponding configuration.

Figure 2:
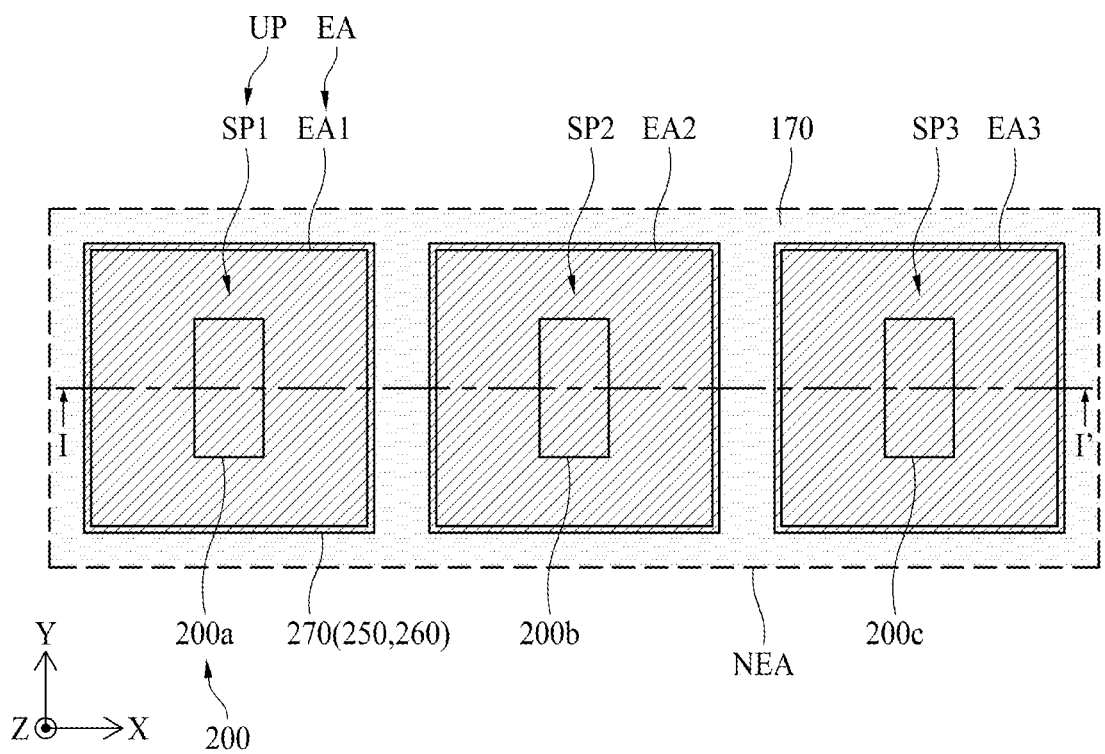
FIG. 2 is a plan view illustrating one example of an optical element and a unit pixel provided in a display area.
Figure 3:
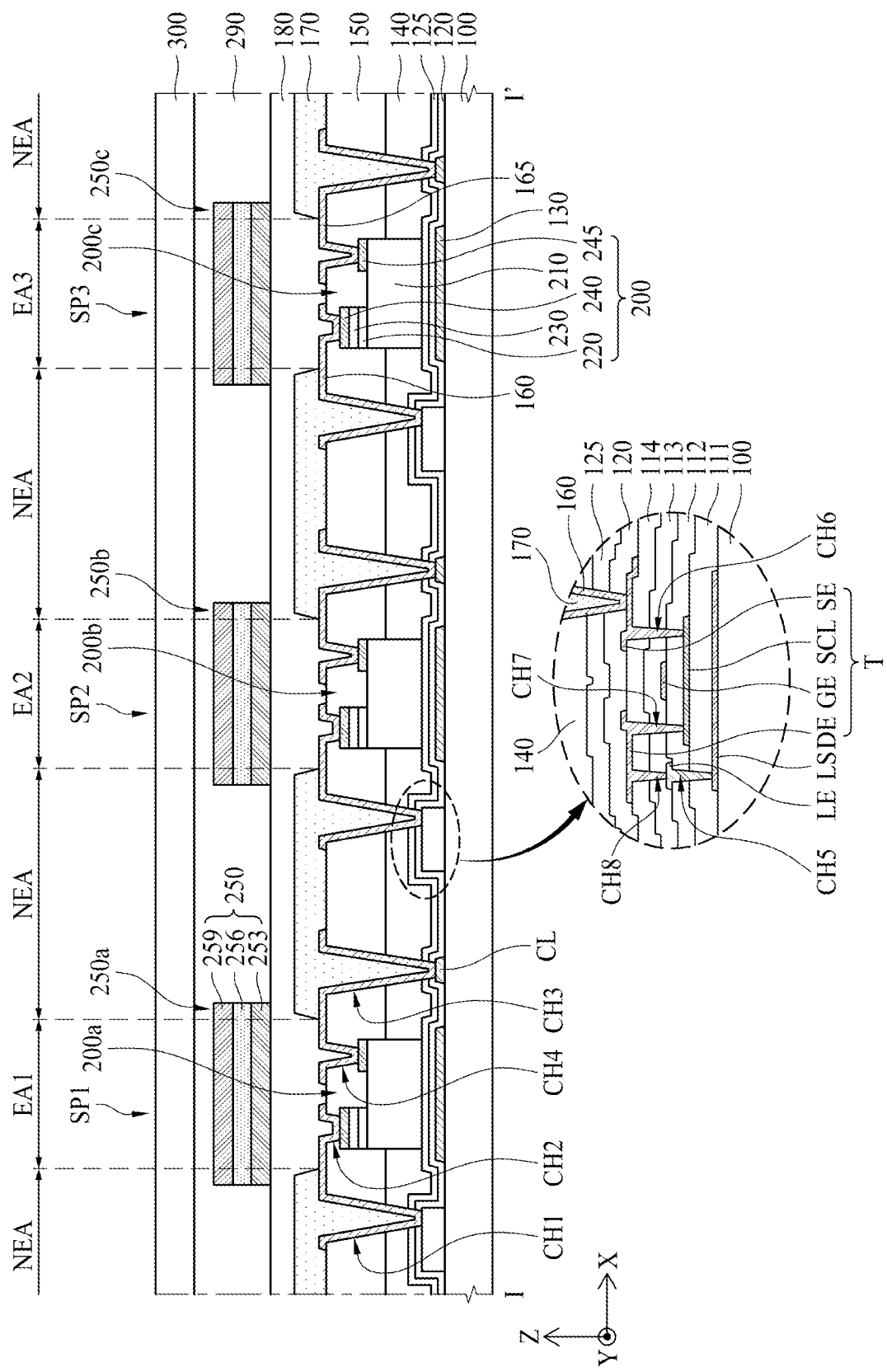
FIG. 3 is a cross sectional view illustrating one example along I-I' of FIG. 2.
Figure 4:
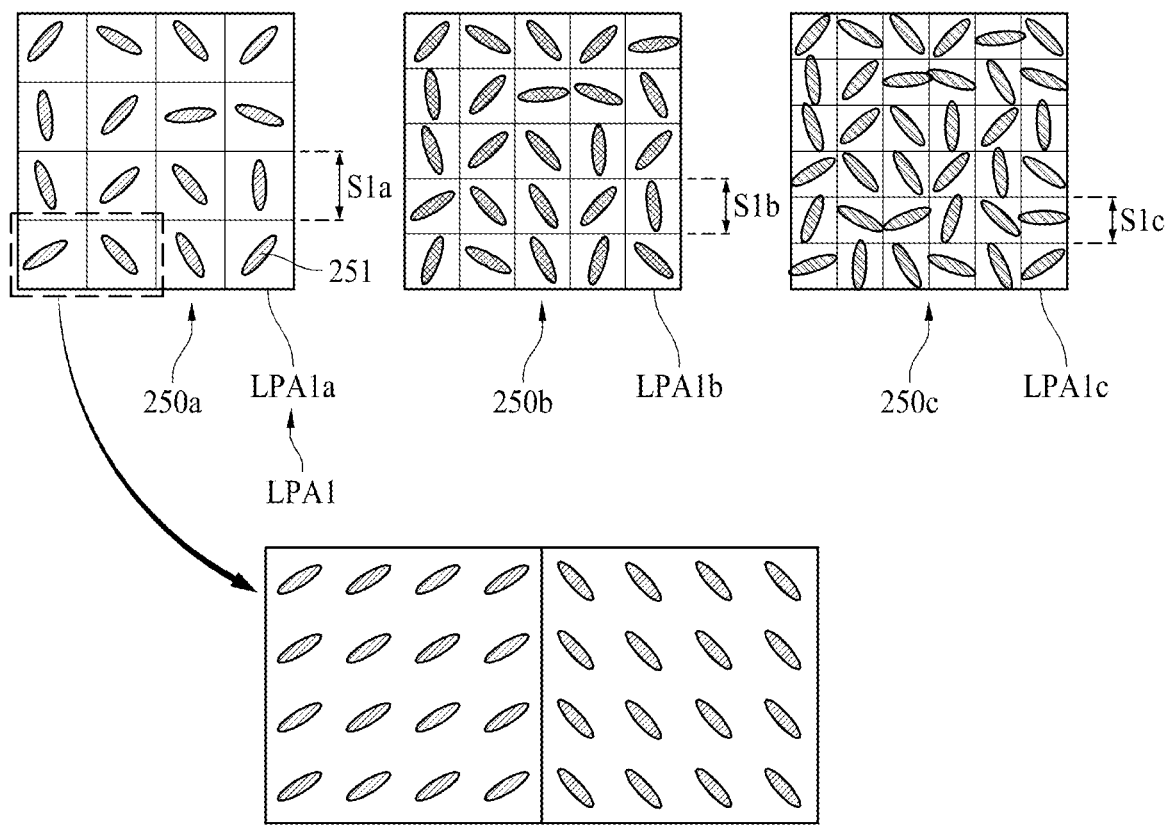
FIG. 4 illustrates one example of randomly distributing liquid crystal molecules in a plurality of liquid crystal pattern areas in each of a first upper optical element, a second upper optical element and a third upper optical element.
Figure 5:
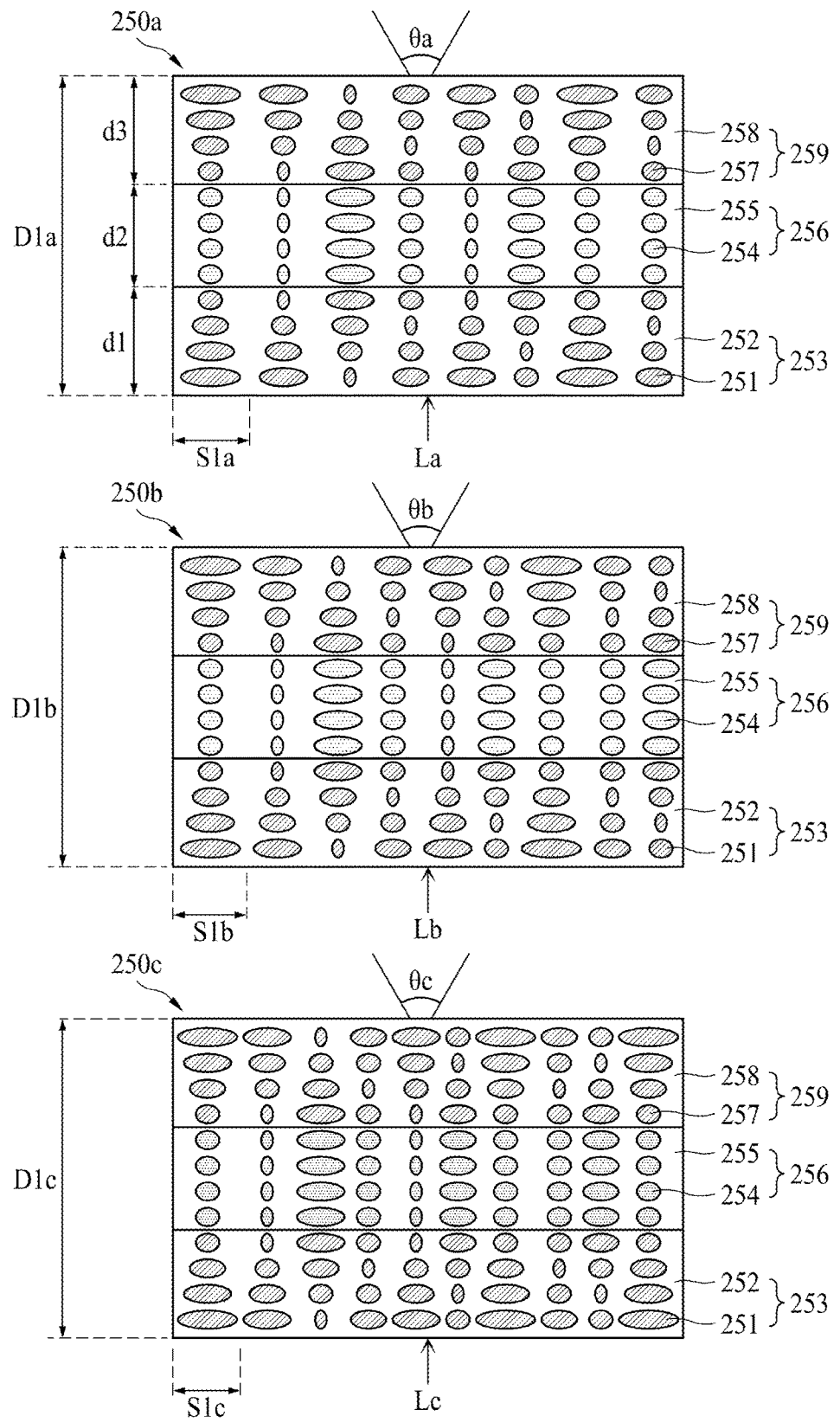
FIG. 5 is a cross sectional view illustrating a structure of the first upper optical element, the second upper optical element and the third upper optical element.

FIG. 2 is a plan view illustrating one example of an optical element and a unit pixel provided in a display area. FIG. 3 is a cross sectional view illustrating one example along I-I' of FIG. 2. FIG. 4 illustrates one example of randomly distributing liquid crystal molecules in a plurality of liquid crystal pattern areas in each of a first upper optical element, a second upper optical element and a third upper optical element. FIG. 5 is a cross sectional view illustrating a structure of the first upper optical element, the second upper optical element and the third upper optical element.

A light emitting diode display device according to one embodiment of the present disclosure includes a plurality of unit pixels UP in a display area AA, and each of the plurality of unit pixels UP includes a first subpixel SP1, a second subpixel SP2, and a third subpixel SP3, as shown in FIG. 2.

The first subpixel SP1 may include a first light emitting area EA1 emitting first color light, the second subpixel SP2 may include a second light emitting area EA2 emitting second color light, and the third subpixel SP3 may include a third light emitting area EA3 emitting third color light.

For example, all first to third light emitting areas EA1, EA2, and EA3 may emit light of different colors. For example, the first light emitting area EA1 may emit red light, the second light emitting area EA2 may emit green light, and the third light emitting area EA3 may emit blue light. In addition, an arrangement order of the respective subpixels SP1, SP2, and SP3 may be variously changed.

According to one embodiment, each of the plurality of unit pixels may further include a white subpixel for emitting white light to improve a luminance.

Meanwhile, FIG. 2 discloses that each unit pixel UP includes one of the first subpixel SP1, one of the second subpixel SP2, and one of the third subpixel SP3, but not limited thereto. According to another embodiment, the unit pixel UP may be provided with two or more of at least one of the first subpixel SP1, the second subpixel SP2, and the third subpixel SP3. As one example, one unit pixel UP may include two of the first subpixels SP1, one of the second subpixel SP2, and one of the third subpixel SP3.

Each of the plurality of subpixels SP1, SP2, and SP3 includes a pixel circuit. The pixel circuit may be provided in a circuit area included in the subpixels SP1, SP2, and SP3 and may be connected to an adjacent gate line GL, an adjacent data line DL, and an adjacent driving power line PL. The pixel circuit may control a current flowing in a light emitting diode 200 according to a data signal from the data line DL in response to a scan pulse from the gate line GL based on a pixel driving power supplied from the driving power line PL. The pixel circuit may include at least one transistor and a capacitor.

The at least one transistor may include a driving transistor T and switching transistors. The switching transistor may be switched according to the scan pulse supplied to the gate line GL to charge the capacitor with a data voltage supplied from the data line DL.

The driving transistor T is switched according to the voltage supplied from the switching transistor or the data voltage charged in the capacitor, thereby generating a data current from power source supplied from the driving power line PL and supplying the data current to the light emitting diode 200 of the subpixels SP1, SP2, and SP3.

As shown in FIG. 3, the light emitting diode display device may include a driving transistor T, a plurality of insulating layers, a light emitting diode 200, a first connection electrode 160, a second connection electrode 165, an optical element, and a second substrate 300 provided over a first substrate 100.

The driving transistor T may include a gate electrode GE, a semiconductor layer SCL, a source electrode SE, and a drain electrode DE. Specifically, a light shielding layer LS may be provided on the first substrate 100. The light shielding layer LS may block light incident on the semiconductor layer SCL of the driving transistor T. According as the light incident on the semiconductor layer SCL of the driving transistor T is blocked by the light shielding layer LS, it is possible to minimize a leakage current.

A buffer layer 111 may be provided over the light shielding layer LS. The buffer layer 111 may reduce penetration of moisture or impurities through the first substrate 110. For example, the buffer layer 111 may include a single layer or multiple layers of silicon oxide SiOx or silicon nitride SiNx, but not limited thereto. However, the buffer layer 111 may be omitted depending on the type of first substrate 110 or the type of transistor, but not limited thereto.

The semiconductor layer SCL of the driving transistor T may be provided over the buffer layer 111. The semiconductor layer SCL may include a semiconductor material such as oxide semiconductor, amorphous silicon, or polysilicon, but not limited thereto.

A gate insulating layer 112 may be provided over the semiconductor layer SCL. The gate insulating layer 112 may include an inorganic layer, for example, a silicon oxide layer SiOx, a silicon nitride layer SiNx, or a multilayer thereof.

The gate electrode GE of the driving transistor T may be provided over the gate insulation layer 112. The gate electrode GE may include a single layer or multiple layers of any one of molybdenum Mo, aluminum Al, chromium Cr, gold Au, titanium Ti, nickel Ni, neodymium Nd, and copper Cu, or an alloy thereof.

A first interlayer insulating layer 113 and a second interlayer insulating layer 114 may be disposed over the gate electrode GE. Contact holes CH6 and CH7 for connecting each of the source electrode SE and the drain electrode DE to the semiconductor layer SCL may be formed in the first interlayer insulating layer 113 and the second interlayer insulating layer 114. The first interlayer insulating layer 113 and the second interlayer insulating layer 114 are insulating layers for protecting the components under the first interlayer insulating layer 113 and the second interlayer insulating layer 114. The first interlayer insulating layer 113 and the second interlayer insulating layer 114 may include a single layer or multilayers of silicon oxide SiOx or silicon nitride SiNx, but not limited thereto.

The source electrode SE and the drain electrode DE of the driving transistor T may be provided over the second interlayer insulating layer 114. The source electrode SE and the drain electrode DE of the driving transistor T may include a single layer or multiple layers of any one of molybdenum Mo, aluminum Al, chromium Cr, gold Au, titanium Ti, nickel Ni, neodymium Nd, and copper Cu, or an alloy thereof.

According to the present disclosure, a first interlayer insulating layer 113 and a second interlayer insulating layer 114, that is, the plurality of insulating layers are disposed between the gate electrode GE and the source electrode SE/drain electrode DE, but not limited thereto. For example, only one insulating layer may be disposed between the gate electrode GE and the source electrode SE/drain electrode DE, but not limited thereto.

When the plurality of insulating layers such as the first interlayer insulating layer 113 and the second interlayer insulating layer 114 are disposed between the gate electrode GE and the source electrode SE/drain electrode DE as shown in the drawings, an electrode may be additionally formed between the first interlayer insulating layer 113 and the second interlayer insulating layer 114. The additionally provided electrode may form a capacitor together with other elements disposed below the first interlayer insulating layer 113 or above the second interlayer insulating layer 114.

An auxiliary electrode LE is disposed over the gate insulation layer 112. The auxiliary electrode LE may be an electrode for electrically connecting the electrode to one of the source electrode SE and the drain electrode DE over the second interlayer insulating layer 114. For example, since the light shielding layer LS is electrically connected to any one of the source electrode SE or the drain electrode DE through the auxiliary electrode LE and does not operate as a floating gate, it is possible to minimize a threshold voltage variation of the driving transistor T generated by the floated light shielding layer LS. In the drawings, the light shielding layer LS is connected to the drain electrode DE through a fifth contact hole CH5 passing through the buffer layer 111 and the gate insulating layer 112, and an eighth contact hole CH8 passing through the first interlayer insulating layer 113 and the second interlayer insulating layer 114. However, the light shielding layer LS may be connected to the source electrode SE, but not limited thereto.

A third interlayer insulating layer 120 may be provided over the source electrode SE and the drain electrode DE of the driving transistor T. The third interlayer insulating layer 120 may be provided to at least partially cover the driving transistor T. The third interlayer insulating layer 120 may include an inorganic layer, for example, a silicon oxide layer SiOx, a silicon nitride layer SiNx, or a multilayer thereof, or may include an organic material such as acryl resin, epoxy resin, phenolic resin, polyamide resin, and polyimide resin. The third interlayer insulating layer 120 may be omittable.

A first planarization layer 140 may be provided over the third interlayer insulating layer 120. The first planarization layer 140 is provided to at least partially cover the driving transistor T, to thereby protect the driving transistor T and to planarize a step difference caused by the driving transistor T. The first planarization layer 140 may include an organic layer such as acryl resin, epoxy resin, phenolic resin, polyamide resin, polyimide resin, etc.

The light emitting diode 200 includes a first semiconductor layer 210, an active layer 220, a second semiconductor layer 230, a first electrode 240, and a second electrode 245.

The first semiconductor layer 210 provides electrons to the active layer 220. According to one embodiment, the first semiconductor layer 210 may include an n-GaN-based semiconductor material, and the n-GaN-based semiconductor material may be GaN, AlGaN, InGaN, or AlInGaN. Herein, impurities used for doping the first semiconductor layer 210 may be Si, Ge, Se, Te, or C.

The active layer 220 may be provided over one side of the first semiconductor layer 210. The active layer 220 has a multi-quantum well MQW structure having a well layer and a barrier layer having a band gap higher than that of the well layer. According to one embodiment, the active layer 220 may have a multiple quantum well structure such as InGaN/GaN.

The second semiconductor layer 230 is provided over the active layer 220 and is configured to provide holes to the active layer 220. According to one embodiment, the second semiconductor layer 230 may include a p-GaN-based semiconductor material, and the p-GaN-based semiconductor material may be GaN, AlGaN, InGaN, or AlInGaN. Herein, impurities used for doping the second semiconductor layer 230 may be Mg. Zn, Be, or the like.

In addition, the first semiconductor layer 210, the active layer 220, and the second semiconductor layer 230 may be sequentially stacked over a semiconductor substrate. The semiconductor substrate includes a semiconductor material such as a sapphire substrate or a silicon substrate. The semiconductor substrate may be used as a growth substrate for growing each of the first semiconductor layer 210, the active layer 220, and the second semiconductor layer 230, and then may be separated from the first semiconductor layer 210 by a substrate separation process. The substrate separation process may be laser lift-off or chemical lift-off. Accordingly, as the semiconductor substrate for growth is removed from the light emitting diode 200, the light emitting diode 200 may have a relatively small thickness.

The first electrode 240 may be provided over the second semiconductor layer 230 and may be electrically connected to the source electrode SE of the driving transistor T. The first electrode 240 may correspond to an anode terminal.

The second electrode 245 may be provided over the other side of the first semiconductor layer 210 so as to be electrically separated from the active layer 220 and the second semiconductor layer 230. The second electrode 245 may be electrically connected to the common power line CL. The second electrode 245 may be a cathode terminal.

The first electrode 240 and the second electrode 245 may include a material including at least one of a metal material such as Au, W, Pt, Si, Ir, Ag. Cu, Ni, Ti, Cr, or an alloy thereof, or may be formed of a transparent conductive material such as Indium Tin Oxide ITO or Indium Zinc Oxide IZO, but not limited thereto.

The light emitting diode 200 may emit light by recombination of electrons and holes according to the current flowing between the first electrode 240 and the second electrode 245. The light generated by the light emitting diode 200 passes through each of the first electrode 240 and the second electrode 245 and is emitted to the outside, to thereby display an image.

In the first planarization layer 140, a groove may be provided in a region corresponding to light emitting areas EA1, EA2, and EA3 of subpixels SP1, SP2, and SP3. The light emitting diode 200 may be accommodated in the groove provided in the first planarization layer 140 and may be electrically connected to the driving transistor T and a common power line CL. The light emitting diode 200 may emit light by a current flowing from the driving transistor T to the common power line CL.

The light emitting diode 200 may be mounted on each of the first subpixel SP1, the second subpixel SP2, and the third subpixel SP3. The light emitting diode 200 may include a first light emitting diode 200a mounted on the first subpixel SP1, a second light emitting diode 200b mounted on the second subpixel SP2, and a third light emitting diode 200c mounted on the third subpixel SP3. For example, the light emitting diode 200 may include the red light emitting diode 200a mounted on the red subpixel SP1, the green light emitting diode 200b mounted on the green subpixel SP2, and the blue light emitting diode 200c mounted on the blue subpixel SP3. A unit pixel UP may further include a white subpixel. In this case, the light emitting diode 200 may further include a white light emitting diode mounted on the white subpixel.

Herein, one or more light emitting diodes 200 may be mounted on each of the first subpixel SP1, the second subpixel SP2, and the third subpixel SP3. For example, the unit pixel UP may include two of the first subpixels SP1, one of the second subpixel SP2, and one of the third subpixel SP3. Each of the two of first subpixels SP1 may include one pixel circuit and one first light emitting diode. Meanwhile, one of the pixel circuit and two of the second light emitting diodes are provided in one of the second subpixel SP2, and two of the second light emitting diodes may share one pixel circuit. In addition, one of the pixel circuit and two of the third light emitting diodes may be provided in one of the third subpixel SP3, and two of the third light emitting diodes may share one pixel circuit.

According to one embodiment of the present disclosure, the light emitting diode display device may further comprise a reflective layer 130 provided between the light emitting diode 200 and the first substrate 100. The reflective layer 130 may be provided to overlap the light emitting area EA including the light emitting diode 200. The reflective layer 130 may be formed of the same material as the source/drain electrodes SE/DE of the driving thin film transistor T and may be provided on the same layer as the source/drain electrodes SE/DE, but not limited thereto. The reflective layer 130 may be formed of the same material as the gate electrode GE of the driving thin film transistor T and may be provided on the same layer as the gate electrode GE. Alternatively, the reflective layer 130 may be provided over the third interlayer insulating layer 120.

The reflective layer 130 may reflect light incident from the light emitting diode 200 toward the light emitting diode 200. Accordingly, the light emitting diode display device according to the present embodiment may have a top emission structure by including the reflective layer 130. However, when the light emitting diode display device has a bottom emission structure, the reflective layer 130 may be omitted.

A second planarization layer 150 may be provided to cover the light emitting diode 200 over the first planarization layer 140. The second planarization layer 150 may be provided to cover the upper surface of the first planarization layer 140 and the side surface and the upper surface of the light emitting diode 200 disposed in the groove of the first planarization layer 140. The second planarization layer 150 may provide a flat surface on the first planarization layer 140. Also, the second planarization layer 150 is buried in the peripheral space of the light emitting diode 200 disposed in the groove of the first planarization layer 140, to thereby fix the position of the light emitting diode 200.

The second planarization layer 150 may include an organic film such as acryl resin, epoxy resin, phenolic resin, polyamide resin, polyimide resin, etc.

The first connection electrode 160 is provided over the second planarization layer 150 and is configured to electrically connect the first electrode 240 of the light emitting diode 200 and the source electrode SE of the driving transistor T. The first connection electrode 160 may be an anode electrode.

In detail, one side of the first connection electrode 160 may be electrically connected to the source electrode SE of the driving transistor T through a first contact hole CH1 passing through the third interlayer insulating layer 120, the first planarization layer 140, and the second planarization layer 150. The other side of the first connection electrode 160 may be electrically connected to the first electrode 240 of the light emitting diode 200 through a second contact hole CH2 provided in the second planarization layer 150. Accordingly, the first electrode 240 of the light emitting diode 200 may be electrically connected to the source electrode SE of the driving transistor T through the first connection electrode 160.

The first connection electrode 160 includes a transparent conductive material. Herein, the transparent conductive material may be Indium Tin Oxide ITO or IZO Indium Zinc Oxide IZO, but not limited thereto.

The second connection electrode 165 is provided over the second planarization layer 150. The second connection electrode 165 is configured to electrically connect the second electrode 245 of the light emitting diode 200 and the common power line CL. The second connection electrode 165 may be a cathode electrode.

More specifically, one side of the second connection electrode 165 may be electrically connected to the common power line CL through a third contact hole CH3 passing through the gate insulating layer 110, the third interlayer insulating layer 120, the first planarization layer 140, and the second planarization layer 150. The other side of the second connection electrode 165 may be electrically connected to the second electrode 245 of the light emitting diode 200 through a fourth contact hole CH4 provided in the second planarization layer 150. Accordingly, the second electrode 245 of the light emitting diode 200 may be electrically connected to the driving power line CL through the second connection electrode 165. The second connection electrode 165 may be formed of the same material as the first connection electrode 160.

The light emitting diode 200 may be attached to an upper surface of the third interlayer insulating layer 120 by a first adhesive layer 125. The first adhesive layer 125 is provided between the third interlayer insulating layer 120 and the light emitting diode 200, to thereby attach the light emitting diode 200 to the upper surface of the third interlayer insulating layer 120. Accordingly, the position of the light emitting diode 200 may be fixed by the first adhesive layer 125.

According to one embodiment of the present disclosure, the light emitting diode display device may further include a bank 170. The bank 170 may be provided on the second planarization layer 150 and is configured to cover at least a portion of the first connection electrode 160 and at least a portion of the second connection electrode 165. The bank 170 may be provided on the first connection electrode 160 provided in a first contact hole CH1 and may be configured to fill the first contact hole CH1. In addition, the bank 170 may be provided on the second connection electrode 165 provided in a third contact hole CH3 and may be configured to fill the third contact hole CH3.

The bank 170 may surround or be adjacent to the light emitting areas EA1, EA2, and EA3 of the respective subpixels SP1, SP2, and SP3. The bank 170 may include an opening area corresponding to the light emitting area EA1, EA2, and EA3 through which light emitted from the light emitting diode 200 is emitted to the outside. The light emitted from the light emitting diode 200 provided in each of the subpixels SP1, SP2, and SP3 may be emitted to the outside in the opening area of the bank 170. Accordingly, the light emitting area EA1, EA2, and EA3 of each of the subpixels SP1, SP2, and SP3 may correspond to the area in which the bank 170 is not formed.

Meanwhile, the bank 170 may include an organic film such as acryl resin, epoxy resin, phenolic resin, polyamide resin, polyimide resin, etc. The bank 170 may include a black material absorbing light. Accordingly, the light emitted from the light emitting diode 200 provided in each of the subpixels SP1, SP2, and SP3 may not be emitted to the outside by the absorption of light in the area where the bank 170 is formed. Accordingly, the area in which the bank 170 is formed may correspond to a non-emission area NEA. The bank 170 prevents the light emitted from the light emitting diode 200 from proceeding to the adjacent subpixels SP1, SP2, and SP3, thereby preventing color mixing between the subpixels SP1, SP2, and SP3.

The third planarization layer 180 may be provided on the bank 170 and the first and second connection electrodes 160 and 165. The third planarization layer 180 may be provided to cover a portion of the first connection electrode 160 and a portion of the second connection electrode 165, which are exposed without being covered by the bank 170 and the upper surface of the bank 170. The third planarization layer 180 may provide a flat surface on the bank 170.

The third planarization layer 180 may include an organic film such as acryl resin, epoxy resin, phenolic resin, polyamide resin, and polyimide resin.

The light emitting diode display device comprises an optical element 270 which is provided to overlap the light emitting area EA and to change the path of light emitted from the light emitting diode 200. The optical element 270 may scatter or reflect the light emitted from the light emitting diode 200 by randomly distributing liquid crystal molecules.

According to one embodiment of the present disclosure, the optical clement 270 may include an upper optical element 250 provided over the light emitting diode 200, as shown in FIG. 3.

Specifically, as the liquid crystal molecules are randomly distributed in the upper optical element 250, the upper optical element 250 may scatter the light emitted from the light emitting diode 200. The upper optical element 250 is characterized in that the liquid crystal molecules are randomly distributed on its surface. Herein, the surface may represent a lower surface or upper surface of the upper optical element 250. Hereinafter, for convenience of description, the liquid crystal molecules are randomly distributed on the lower surface of the upper optical element 250. In addition, the random distribution indicates that the liquid crystal molecules are arranged in different arbitrary directions without being constantly arranged.

The light emitted from the light emitting diode 200 may be incident on the lower surface of the upper optical element 250 and may be transmitted through the upper optical element 250 to the upper surface. The light emitted from the light emitting diode 200 may have a specific wavefront. When light having the specific wavefront is incident on the liquid crystal molecule randomly distributed on the lower surface of the upper optical element 250, the wavefront of the light may be randomly changed and then emitted to the upper surface of the upper optical element 250. At this time, the wavefront of the light transmitted through the upper optical element 250 may cause interference and diffraction, whereby the light may be scattered and diffused.

In the light emitting diode display device according to one embodiment of the present disclosure, the liquid crystal molecules are randomly distributed in the upper optical element 250 so that it is possible to scatter and diffuse the light emitted by the light emitting diode 200. The light generated by the light emitting diode 200 may have a luminance distribution of 'M' shape having a maximum luminance at a viewing angle greater than 0°. For example, the light generated by the light emitting diode 200 may have a maximum luminance at a viewing angle of 60°. Accordingly, the luminance distribution of 'M' shape is inefficient because the luminance at the front surface (0°) is low. In case of the light emitting diode display device according to one embodiment of the present disclosure, the upper optical clement 250 is provided over the light emitting diode 200 so that it is possible to change the path of light emitted from the light emitting diode 200, to thereby increase the luminance at the front surface (0°).

The upper optical element 250 may include a plurality of upper liquid crystal layers 253, 256, and 259. For example, as shown in FIGS. 3 and 5, the upper optical element 250 may include a first upper liquid crystal layer 253 and a second upper liquid crystal layer 259. According to one embodiment, the upper optical element 250 may further include a third upper liquid crystal layer 256.

The first upper liquid crystal layer 253 includes first liquid crystal molecules 251. The first liquid crystal molecules 251 may be randomly distributed on the lower surface of the first upper liquid crystal layer 253. For example, as shown in FIG. 4, the first upper liquid crystal layer 253 may be divided into a plurality of liquid crystal pattern areas LPA1, and the first liquid crystal molecules 251 may be randomly distributed in each of the plurality of divided liquid crystal pattern areas LPA1. The arrangement directions of the first liquid crystal molecules 251 are different for each liquid crystal pattern area LPA1. The plurality of first liquid crystal molecules 251 may be disposed in each of the plurality of liquid crystal pattern areas LPA1, and the first liquid crystal molecules 251 disposed in the same liquid crystal pattern area LPA1 may be aligned in the same direction.

As shown in FIG. 5, the first upper liquid crystal layer 253 may be formed by stacking the first liquid crystal molecules 251 twisted with respect to each of the first liquid crystal molecules 251 disposed on the lower surface. The first liquid crystal molecules 251 may be twisted in a first direction from the lowermost layer to the uppermost layer.

The first upper liquid crystal layer 253 may fix the first liquid crystal molecule 251 in an initial arrangement direction by using reactive mesogen RM 252. The RM 252 is a photoreactive compound, which may be cured in response to light such as ultraviolet light UV. The first liquid crystal molecules 251 may be fixed in the initial arrangement direction while the RM is cured.

The second upper liquid crystal layer 259 is provided on the first upper liquid crystal layer 253 and is configured to include second liquid crystal molecules 257. When the upper optical clement 250 includes the third upper liquid crystal layer 256, the second upper liquid crystal layer 259 may be provided on the third upper liquid crystal layer 256. The second liquid crystal molecules 257 may be randomly distributed on the lower surface of the second upper liquid crystal layer 259. In this case, the second liquid crystal molecules 257 disposed on the lower surface of the second upper liquid crystal layer 259 may be aligned along the arrangement direction of third liquid crystal molecules 254 disposed on the upper surface of the third upper liquid crystal layer 256.

In addition, as shown in FIG. 5, the second upper liquid crystal layer 259 may be formed by stacking the second liquid crystal molecules 257 twisted with respect to each of the second liquid crystal molecules 257 disposed on the lower surface. In this case, the second liquid crystal molecules 257 may be twisted at the same angle from the lowermost layer to the uppermost layer, wherein the second liquid crystal molecules 257 may be stacked while being twisted at a second direction opposite to the first direction. The second liquid crystal molecules 257 provided in the second upper liquid crystal layer 259 may have a symmetrical structure with the first liquid crystal molecules 251 provided in the first upper liquid crystal layer 253.

The third upper liquid crystal layer 256 is provided between the first upper liquid crystal layer 253 and the second upper liquid crystal layer 259 and is configured to include the third liquid crystal molecules 254. The third liquid crystal molecules 254 may be randomly distributed on the lower surface of the third upper liquid crystal layer 256. In this case, the third liquid crystal molecules 254 disposed on the lower surface of the third upper liquid crystal layer 256 may be aligned along the arrangement direction of the first liquid crystal molecules 251 disposed on the upper surface of the first upper liquid crystal layer 253.

Also, as shown in FIG. 5, the third upper liquid crystal layer 256 may be formed by stacking the third liquid crystal molecules 254 having the same or similar direction with respect to each of the third liquid crystal molecules 254 disposed on the lower surface. The third upper liquid crystal layer 256 may be formed by arranging the third liquid crystal molecules 254, which are stacked in a vertical direction, in the same direction without being twisted, or may be formed by arranging the third liquid crystal molecules 254 at a twist angle smaller than '1'. Herein, the twist angle may indicate an angle difference between the third liquid crystal molecule 254 of the lowermost layer and the third liquid crystal molecule of the uppermost layer.

In the same manner as the first upper liquid crystal layer 253, the third upper liquid crystal layer 256 may fix the third liquid crystal molecules 254 in the initial arrangement direction by using the RM 255.

According to one embodiment, the first liquid crystal molecules 251, the third liquid crystal molecules 254, and the second liquid crystal molecules 257 may be nematic liquid crystal. In case of the first upper liquid crystal layer 253, the first liquid crystal molecules 251, which are nematic liquid crystals, may be twisted and stacked in the vertical direction on the first substrate 100 by using a chiral dopant. In this case, the chiral dopant added to the first upper liquid crystal layer 253 may have a molecular structure capable of twisting the first liquid crystal molecules 251 in the first direction. Meanwhile, the third upper liquid crystal layer 256 may align the third liquid crystal molecules 254, which are nematic liquid crystals, in a state in which the chiral dopant is not added. In case of the second upper liquid crystal layer 259, the second liquid crystal molecules 257, which are nematic liquid crystals, may be twisted and stacked in the vertical direction on the first substrate 100 by using a chiral dopant. In this case, the chiral dopant added to the second upper liquid crystal layer 259 is different from the chiral dopant added to the first upper liquid crystal layer 253, and the chiral dopant added to the second upper liquid crystal layer 259 may have a molecular structure capable of twisting the second liquid crystal molecules 257 in the second direction.

According to one embodiment, a thickness d1 of the first upper liquid crystal layer 253 may be the same as a thickness d3 of the second upper liquid crystal layer 259. A thickness d2 of the third upper liquid crystal layer 256 may be the same as the thickness d1 of the first upper liquid crystal layer 253 and the thickness d3 of the second upper liquid crystal layer 259, but not limited thereto. According to another embodiment, the thickness d2 of the third upper liquid crystal layer 256 may be different from the thickness d1 of the first upper liquid crystal layer 253 and the thickness d3 of the second upper liquid crystal layer 259.

In the light emitting diode display device according to one embodiment of the present disclosure, the upper optical clement 250 comprises the first upper liquid crystal layer 253 including the first liquid crystal molecules 251 twisted in the first direction and the second upper liquid crystal layer 259 including the second liquid crystal molecules 257 twisted in the second direction opposite to the first direction, so that it is possible to realize high efficiency of light in all visible light wavelengths. While the light emitted from the light emitting diode 200 passes through the first upper liquid crystal layer 253 and the second upper liquid crystal layer 259, a delay phenomenon may occur due to linear birefringence and circular birefringence. In this case, the linear birefringence becomes smaller as the wavelength increases, while the circular birefringence becomes larger as the wavelength increases. As described above, the linear birefringence and the circular birefringence are opposite to each other in effects according to the wavelength change. Thus, change values of the linear birefringence and the change value of the circular birefringence may be offset from each other even if the wavelength is changed.

Accordingly, the upper optical element 250 including the first upper liquid crystal layer 253 and the second upper liquid crystal layer 259 is designed such that the total birefringence of the linear birefringence and the circular birefringence for all wavelengths of the light is delayed by the half of the wavelength. The upper optical element 250 including the first upper liquid crystal layer 253 and the second upper liquid crystal layer 259 may have the thickness d1 and d3 and the twist angle of the first liquid crystal molecules 251 and the second liquid crystal molecules 257 in which the delay may occur by the half of the wavelength with respect to all wavelengths. In case of the light emitting diode display device according to one embodiment of the present disclosure, circularly polarized light incident on the upper optical element 250 from the light emitting diode 200 may be converted into circularly polarized light in the opposite direction while being transmitted through the upper optical element 250. The light emitted from the light emitting diode 200 and transmitted through the first upper liquid crystal layer 253 and the second upper liquid crystal layer 259 may be converted into light at high efficiency in all visible light wavelengths.

The light emitting diode display device according to one embodiment of the present disclosure includes the third upper liquid crystal layer 256 between the first upper liquid crystal layer 253 and the second upper liquid crystal layer 259, thereby having high efficiency regardless of the incident angle of light. When the upper optical element 250 includes only the first upper liquid crystal layer 253 and the second upper liquid crystal layer 259, the first upper liquid crystal layer 253 and the second upper liquid crystal layer 259 have a symmetrical structure in the vertical direction, whereby the upper optical element 250 may have high efficiency close to 100% for the light incident on the front surface, that is, the light having incident angle of 0°. However, since the first liquid crystal molecules 251 and the second liquid crystal molecules 257 existing on the path do not have a symmetrical structure, the total birefringence may be changed and the path length may be increased in the light having the incident angle other than 0°, as compared to the light having the incident angle of 0°. Accordingly, the upper optical element 250 may reduce light conversion efficiency for the light having the incident angle other than 0°.

The light emitting diode display device according to one embodiment of the present disclosure may be provided with the third upper liquid crystal layer 256 between the first upper liquid crystal layer 253 and the second upper liquid crystal layer 259, and also may be provided with the upper optical element 250 designed to have high light conversion efficiency even for the light other than 0° by adjusting the thickness d2 of the third upper liquid crystal layer 256 and the twist angle of the third liquid crystal molecule 254. The upper optical element 250 including the first upper liquid crystal layer 253, the second upper liquid crystal layer 259, and the third upper liquid crystal layer 256 has the high light conversion efficiency for the light having the incident angle other than 0° as well as the light having the incident angle of 0°, with respect to light having a red wavelength band, for example, 635 nm. Also, the upper optical element 250 including the first upper liquid crystal layer 253, the second upper liquid crystal layer 259, and the third upper liquid crystal layer 256 has the high light conversion efficiency for the light having the incident angle other than 0° as well as the light having the incident angle of 0°, with respect to light having a green wavelength band, for example, 532 nm and light having a blue wavelength band, for example, 457 nm.

The upper optical element 250 may be patterned for each subpixel SP1, SP2, and SP3. Specifically, the upper optical element 250 may include a first upper optical element 250a provided in the first subpixel SP1, a second upper optical element 250b provided in the second subpixel SP2, and a third upper optical element 250c provided in the third subpixel SP3.

The first upper optical element 250a may be provided on the first light emitting diode 200a and may be configured to scatter the first light emitted from the first light emitting diode 200a. The first light may have a first peak wavelength. For example, the first light may be red light and the peak wavelength may be 625 nm. The first upper optical element 250a may have an area equal to or larger than that of the first light emitting area EA1 and may be disposed to overlap the first light emitting area EA1.

The second upper optical element 250b may be provided on the second light emitting diode 200b and may be configured to scatter the second light emitted from the second light emitting diode 200b. The second light may have a second peak wavelength shorter than the first peak wavelength. For example, the second light may be green light and the peak wavelength may be 530 nm. The second upper optical element 250b may have an area equal to or larger than that of the second light emitting area EA2 and may be disposed to overlap the second light emitting area EA2.

The third upper optical element 250c may be provided on the third light emitting diode 200c and may be configured to scatter the third light emitted from the third light emitting diode 200c. The third light may have a third peak wavelength shorter than the second peak wavelength. For example, the third light may be blue light and the peak wavelength may be 461 nm. The third upper optical element 250c may have an area equal to or larger than that of the third light emitting area EA3 and may be disposed to overlap the third light emitting area EA3.

The first upper optical element 250a, the second upper optical element 250b, and the third upper optical element 250c may be spaced apart from each other. Each of the first upper optical element 250a, the second upper optical element 250b, and the third upper optical element 250c may be formed in a film shape through a separate manufacturing process and then may be attached or deposited on the third planarization layer 180.

According to one embodiment, each of the first upper optical element 250a, the second upper optical element 250b, and the third upper optical element 250c may be formed in the form of film through a manufacturing process consisting of a photo patterning process, a first spin coating process, a first polymerization process, a second spin coating process, a second polymerization process, a third spin coating process, a third polymerization process, and a removal process. In addition to the spin coating process, various methods such as bar coating may be used.

First, the photo patterning process may pattern a pattern for alignment of the liquid crystal molecules on a base substrate. For example, azobenzene in which molecules are aligned in a direction perpendicular to the linear polarization may be formed on the base substrate. When visible light having a blue wavelength is irradiated, the azobenzene may be converted into a trans type by a cis-trans conversion and may be aligned in a direction perpendicular to the linearly polarized light. The photo patterning process is carried out by irradiating the linearly polarized light having different rotation angles depending on the position to the azobenzene, thereby randomly patterning the alignment direction of the azobenzene.

Then, the first spin coating process may spin-coat a material forming the first upper liquid crystal layer 253 on the base substrate patterned with the azobenzene. The material for the first upper liquid crystal layer 253 may include the first liquid crystal molecule 251, RM 252, and chiral dopant for twisting the first liquid crystal molecule 251 in the first direction. The first liquid crystal molecules 251 disposed on the surface contacting the azobenzene may be aligned along the alignment direction of the patterned azobenzene and may be twisted in the first direction on the vertical direction.

For the first polymerization process, the RM 252 may be cured by irradiating UV light, to thereby fix the first liquid crystal molecule 251 in the alignment direction. Accordingly, the first upper liquid crystal layer 253 may be formed.

Then, the second spin coating process may spin-coat a material forming the third upper liquid crystal layer 256 on the first upper liquid crystal layer 253. Herein, the material forming the third upper liquid crystal layer 256 may include the third liquid crystal molecule 254 and RM 255. The third liquid crystal molecules 254 disposed on the surface contacting the first upper liquid crystal layer 253 may be aligned along the alignment direction of the first liquid crystal molecules 251 disposed on the uppermost layer of the first upper liquid crystal layer 253 and may be aligned in a predetermined direction without twisting in the vertical direction.

For the second polymerization process, the RM 255 may be cured by irradiating UV light, to thereby fix the third liquid crystal molecule 254 in the alignment direction. Accordingly, the third upper liquid crystal layer 256 may be formed.

Then, the third spin coating process may spin-coat a material forming the second upper liquid crystal layer 259 on the third upper liquid crystal layer 256. The material for the second upper liquid crystal layer 259 may include the second liquid crystal molecule 257, RM 258, and chiral dopant for twisting the second liquid crystal molecule 257. The second liquid crystal molecules 257 disposed on the surface contacting the third upper liquid crystal layer 256 may be aligned along the alignment direction of the third liquid crystal molecules 254 disposed on the uppermost layer of the third upper liquid crystal layer 256 and may be twisted in the second direction on the vertical direction.

For the third polymerization process, the RM 258 may be cured by irradiating UV light, to thereby fix the second liquid crystal molecule 257 in the alignment direction. Accordingly, the second upper liquid crystal layer 259 may be formed.

Finally, the upper optical element 250 in the form of film may be formed by removing the base substrate patterned with the azobenzene. The first upper optical element 250a, the second upper optical element 250b, and the third upper optical element 250c may be formed through separate manufacturing processes, respectively, and may be attached or deposited to respective regions overlapping the corresponding light emitting diodes 200a, 200b, and 200c. The first upper optical element 250a may be attached or deposited on the third planarization layer 180 and may be configured to overlap the first light emitting area EA1 for emitting the first light emitted from the first light emitting diode 200a to the outside. The second upper optical element 250b may be attached or deposited on the third planarization layer 180 and may be configured to overlap the second light emitting area EA2 for emitting the second light emitted from the second light emitting diode 200b to the outside. The third upper optical element 250c may be attached or deposited on the third planarization layer 180 and may be configured to overlap the third light emitting area EA3 for emitting the third light emitted from the third light emitting diode 200c to the outside.

The first upper optical clement 250a, the second upper optical element 250b, and the third upper optical clement 250c are not formed as a single layer. Each of the first upper optical clement 250a, the second upper optical element 250b, and the third upper optical element 250c may be manufactured in the form of film through the separate manufacturing process and then attached to or deposited on the corresponding light emitting area EA1, EA2, and EA3. The first upper optical clement 250a, the second upper optical element 250b, and the third upper optical clement 250c may respectively have an area equal to or larger than the corresponding light emitting area EA1, EA2, and EA3 for scattering the light, and may be configured to cover the light emitting area EA1, EA2, and EA3. In this case, the first upper optical element 250a, the second upper optical element 250b, and the third upper optical element 250c need not cover up to a non-light emitting area NEA. Preferably, the first upper optical element 250a, the second upper optical element 250b, and the third upper optical element 250c do not have an excessively large area so as not to overlap another adjacent light emitting area due to errors of the attachment or deposition process. Accordingly, the first upper optical clement 250a, the second upper optical element 250b, and the third upper optical clement 250c may be not overlapped with each other and may be spaced apart from each other.

On the other hand, the first upper optical element 250a, the second upper optical clement 250b, and the third upper optical element 250c may have the same thickness D1a, D1b, and D1c. Since the first upper optical clement 250a, the second upper optical element 250b, and the third upper optical clement 250c have the high light conversion efficiency close to 100% in all visible light wavelengths, the first upper optical element 250a, the second upper optical element 250b, and the third upper optical element 250c may have the same thickness D1a, D1b, and D1c regardless of the wavelength band of incident light.

Also, the light La incident on the lower surface of the first upper optical element 250a from the first light emitting diode 200a may be diffused at a first diffusion angle θa while being transmitted through the first upper optical element 250a and may be emitted to the upper surface of the first upper optical element 250a. The light Lb incident on the lower surface of the second upper optical element 250b from the second light emitting diode 200b may be diffused at a second diffusion angle θb while being transmitted through the second upper optical element 250b and may be emitted to the upper surface of the second upper optical element 250b. The light Lc incident on the lower surface of the third upper optical element 250c from the third light emitting diode 200c may be diffused at a third diffusion angle θc while being transmitted through the third upper optical clement 250c and may be emitted to the upper surface of the third upper optical element 250c. In the light emitting diode display device according to one embodiment of the present disclosure, the first diffusion angle θa of the first upper optical element 250a, the second diffusion angle θb of the second upper optical element 250b, and the third diffusion angle θc of the third upper optical element 250c may be the same. The diffusion angle of the light indicates the extent to which the incident light is diffused while being transmitted through the upper optical element 250 and may be expressed by Equation 1 below.

$$\theta = 2\, \tan^{-1}\left(\frac{\lambda}{np}\right) \qquad \text{Equation 1}$$

Herein, 'θ' denotes the diffusion angle, 'λ' denotes the wavelength of light, 'n' denotes the refractive index of medium through which the light propagates, and 'p' denotes the size of liquid crystal pattern area LPA1, for example, a horizontal or vertical length of the liquid crystal pattern area LPA1.

Referring to the above Equation 1, the diffusion angle of light may vary depending on the wavelength of light, the refractive index of medium, and the size of liquid crystal pattern area LPA1. The diffusion rate of light may be proportional to the wavelength of light. That is, the diffusion rate of light may increase as the wavelength of light increases. On the other hand, the diffusion rate of light may be inversely proportional to the refractive index of medium and the size of liquid crystal pattern area LPA1. The diffusion speed of light may decrease as the refractive index of medium increases, and the diffusion speed of light may decrease as the size of liquid crystal pattern area LPA1 increases.

Since the light passing through the first upper optical element 250a, the second upper optical element 250b, and the third upper optical element 250c passes through the same medium as the air or second adhesive layer 290, the refractive index of medium with respect to each of the first upper optical element 250a, the second upper optical element 250b, and the third upper optical element 250c may be the same. However, the first upper optical element 250a, the second upper optical element 250b, and the third upper optical element 250c may have different wavelength bands of the incident light. The first light emitted from the first light emitting diode 200a may be incident on the first upper optical element 250a. In this case, the first light may be light in a red wavelength range. For example, the first light may have a peak wavelength of 625 nm. The second light emitted from the second light emitting diode 200b may be incident to the second upper optical element 250b. In this case, the second light may be light in a green wavelength range. For example, the second light may have a peak wavelength of 530 nm. The third light emitted from the third light emitting diode 200c may be incident on the third upper optical element 250c. The third light may be light in a blue wavelength band. For example, the third light may have a peak wavelength of 461 nm.

As described above, the first upper optical element 250a, the second upper optical element 250b, and the third upper optical element 250c have different wavelength bands of incident light. Thus, if the size of liquid crystal pattern area LPA1 and the refractive index of medium are the same, the first upper optical element 250a, the second upper optical element 250b, and the third upper optical element 250c may have different diffusion angles with respect to incident light. In this case, it is difficult to realize an accurate color and image in the light emitting diode display device. Specifically, the light emitting diode display device may display a specific color by mixing the first light transmitted through the first upper optical element 250a, the second light transmitted through the second upper optical element 250b, and the third light transmitted through the third upper optical element 250c. When the first light transmitted through the first upper optical element 250a, the second light transmitted through the second upper optical element 250b, and the third light transmitted through the third upper optical element 250c have the respectively different diffusion angles, the propagation direction of light becomes different from each other so that it is impossible to realize an accurate color.

For example, the diffusion angle of the first light may be greater than the diffusion angle of the second light and the third light. When the viewing angle is located within the diffusion angle of the second light and the third light, mixed light of the first light, the second light, and the third light may be visible. Meanwhile, when the viewing angle deviates from the diffusion angle of the second light and the third light, only the first light may be visible.

In order to solve such a problem, the size of the liquid crystal pattern area LPA1 may be differently formed in each of the first upper optical element 250a, the second upper optical element 250b, and the third upper optical element 250c in the light emitting diode display device according to one embodiment of the present disclosure.

Referring to FIGS. 4 and 5, the first upper optical element 250a may be divided into a plurality of first liquid crystal pattern areas LPA1a, the second upper optical element 250b may be divided into a plurality of second liquid crystal pattern areas LPA1b, and the third upper optical element 250c may be divided into a plurality of third liquid crystal pattern areas LPA1c. Each of the first liquid crystal pattern area LPA1a, the second liquid crystal pattern area LPA1b, and the third liquid crystal pattern area LPA1c may represent a unit area in which liquid crystal molecules aligned in the same direction in each of the first upper optical element 250a, the second upper optical element 250b, and the third upper optical element 250c are arranged to be adjacent to each other.

The first liquid crystal pattern area LPA1a, the second liquid crystal pattern area LPA1b, and the third liquid crystal pattern area LPA1c may have different sizes from each other. The size of each of the first liquid crystal pattern area LPA1a, the second liquid crystal pattern area LPA1b, and the third liquid crystal pattern area LPA1c may be determined based on the incident wavelength band. In the light emitting diode display device according to one embodiment of the present disclosure, the size S1a of the first liquid crystal pattern area LPA1a, the size S1b of the second liquid crystal pattern area LPA1b, and the size S1c of the third liquid crystal pattern area LPA1c may be determined to have the same diffusion angle based on the above Equation 1 in the first upper optical element 250a, the second upper optical element 250b, and the third upper optical element 250c.

The size S1a of the first liquid crystal pattern area LPA1a of the first upper optical element 250a may be greater than the size S1b of the second liquid crystal pattern area LPA1b of the second upper optical element 250b. The first upper optical element 250a and the second upper optical element 250b may have the same size. In this case, the number of first liquid crystal pattern areas LPA1a may be smaller than the number of second liquid crystal pattern areas LPA1b.

On the other hand, the size S1c of the third liquid crystal pattern area LPA1c of the third upper optical element 250c may be smaller than the size S1b of the second liquid crystal pattern area LPA1b of the second upper optical element

250b. The second upper optical element 250b and the third upper optical element 250c may have the same size. In this case, the number of third liquid crystal pattern areas LPA1c may be larger than the number of second liquid crystal pattern areas LPA1b.

Herein, the size S1a of the first liquid crystal pattern area LPA1a may indicate the horizontal length or vertical length of the first liquid crystal pattern area LPA1a, the size S1b of the second liquid crystal pattern area LPA1b may indicate the horizontal length or vertical length of the second liquid crystal pattern area LPA1b, and the size S1c of the third liquid crystal pattern area LPA1c may indicate the horizontal length or vertical length of the third liquid crystal pattern area LPA1c.

The light emitting diode display device according to one embodiment of the present disclosure adjusts the sizes S1a, S1b, and S1c of the liquid crystal pattern areas LPA1a, LPA1b, and LPA1c of the first upper optical element 250a, the second upper optical element 250b, and the third upper optical element 250c so that the first upper optical element 250a, the second upper optical element 250b, and the third upper optical element 250c may have the same diffusion angle with respect to incident light. Accordingly, the light emitting diode display device according to one embodiment of the present disclosure may scatter and diffuse the light by using the first upper optical element 250a, the second upper optical element 250b, and the third upper optical element 250c, and simultaneously implement accurate colors and images.

The second substrate 300 is disposed to cover other portions except a pad portion of the first substrate 100, to thereby protect a pixel array provided on the first substrate 100. The second substrate 300 may be referred to as an opposite substrate, an encapsulation substrate, or a color filter array substrate. The second substrate 300 may be bonded to the first substrate 100 by a second adhesive layer 290. The second substrate 300 may be formed of a transparent glass material or a transparent plastic material, but not limited thereto.

The light emitting diode display device according to one embodiment of the present disclosure includes the upper optical element 250 on the light emitting diode 200 so that it is possible to change the path of light emitted from the light emitting diode 200, thereby improving the luminance at the front surface (0°) and improving the luminance distribution for each inefficient viewing angle of the light emitting diode 200.

In addition, since the light emitted from the light emitting diode 200 is scattered and diffused by the upper optical element 250, the light emitting diode display device according to one embodiment of the present disclosure can prevent the luminance distribution for each viewing angle from being biased to one side even when a transfer tolerance occurs.

Also, in case of the light emitting diode display device according to one embodiment of the present disclosure, the upper optical film 250 is manufactured in a film form through a separate manufacturing process, the upper optical element 250 may be additionally provided without affecting a manufacturing process of the existing light emitting diode display device.

Also, in case of the light emitting diode display device according to one embodiment of the present disclosure, since the upper optical element 250 is manufactured in a thin film form, there is no need to secure an optical distance between the upper optical element 250 and the light emitting diode 200. Accordingly, the light emitting diode display device according to one embodiment of the present disclosure may have a simplified manufacturing process and a thin profile of device, as compared to a related art device using a lens.

FIG. 3 shows that the optical element 270 is provided on the light emitting diode 200, but not necessarily limited thereto. According to another embodiment, the optical element 270 may be provided below the light emitting diode 200. Hereinafter, a lower optical element 260 provided under the light emitting diode 200 will be described in detail with reference to FIGS. 6 to 10.

Figure 6:
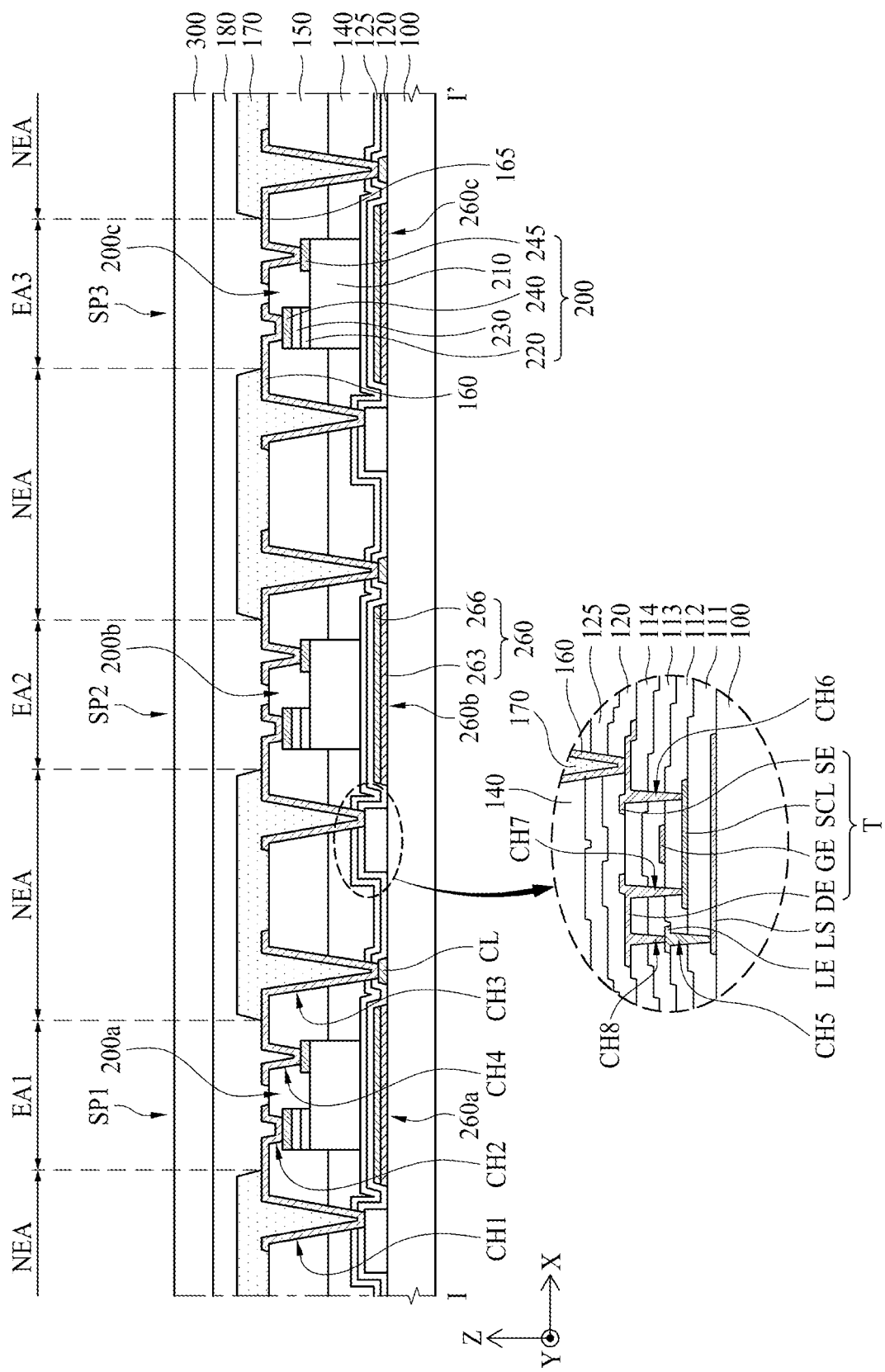
FIG. 6 is a cross sectional view illustrating another example along I-I' of FIG. 2.
Figure 7:
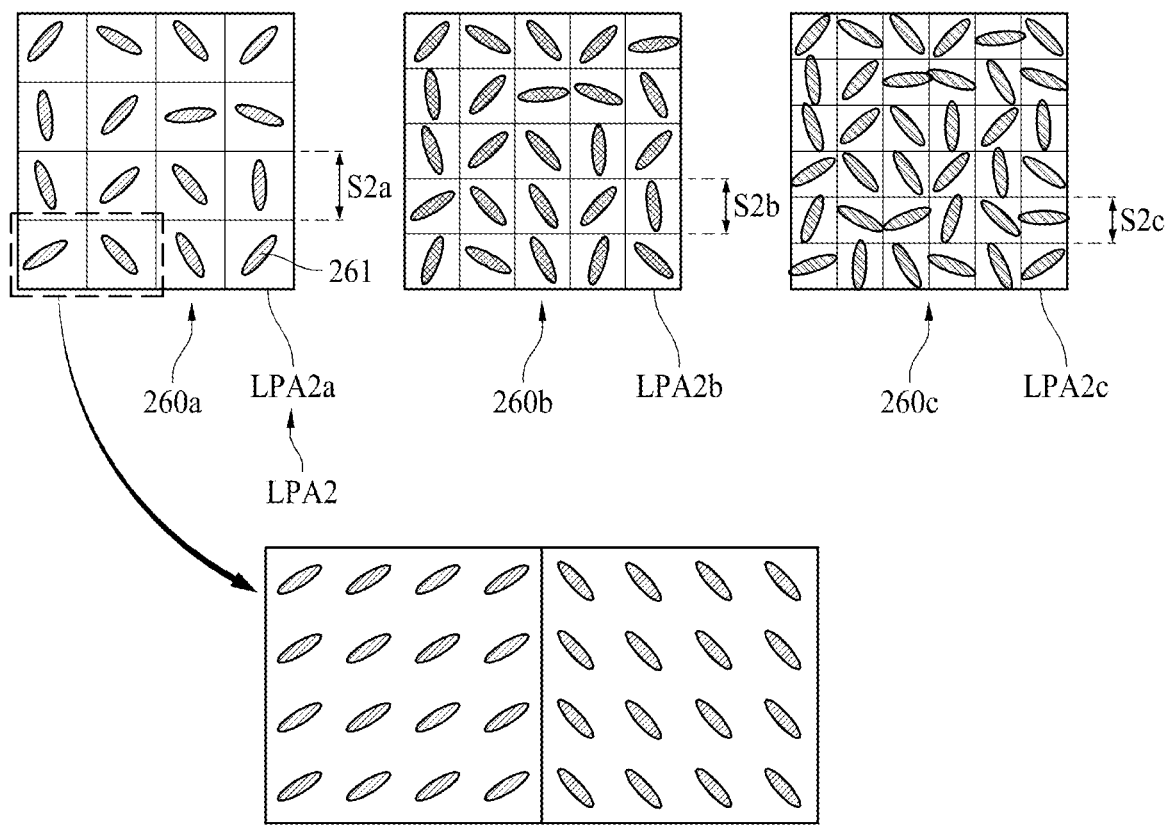
FIG. 7 illustrates one example of randomly distributing liquid crystal molecules in a plurality of liquid crystal pattern areas in each of a first lower optical element, a second lower optical element and a third lower optical element.
Figure 8:
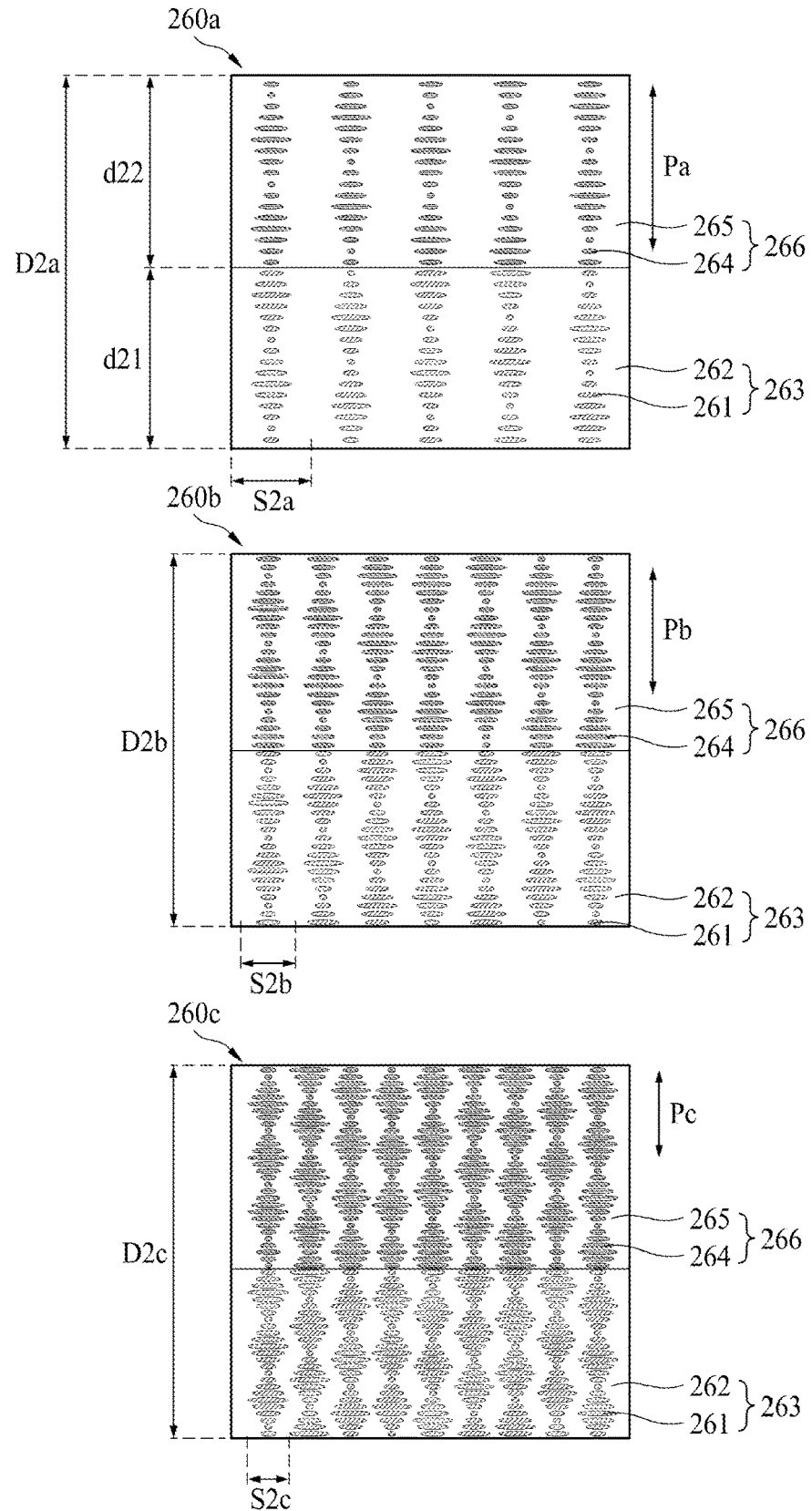
FIG. 8 is a cross sectional view illustrating a structure of the first lower optical element, the second lower optical element and the third lower optical element.
Figure 9A:
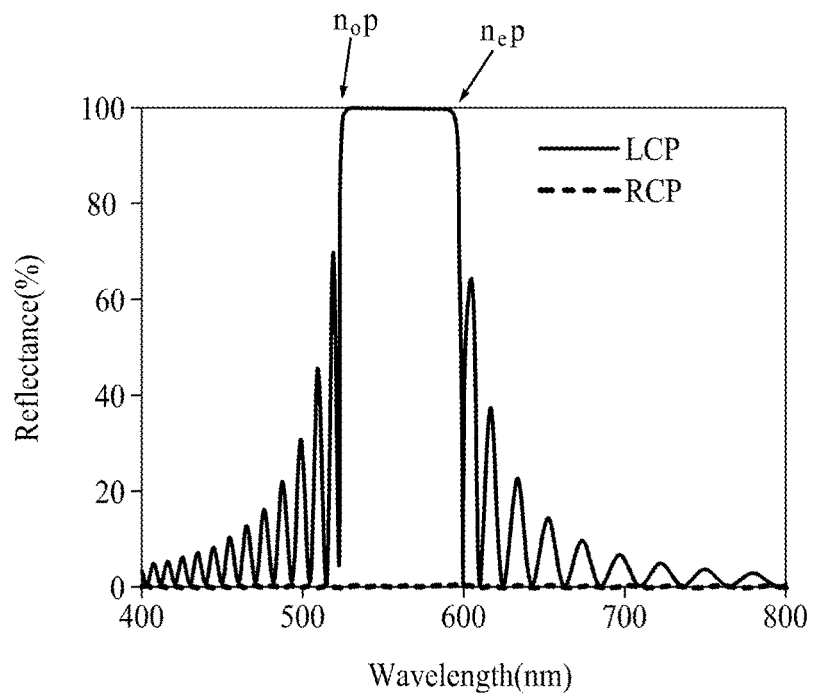
FIG. 9A illustrates a reflectance by each wavelength of a first lower liquid crystal layer.
Figure 9B:
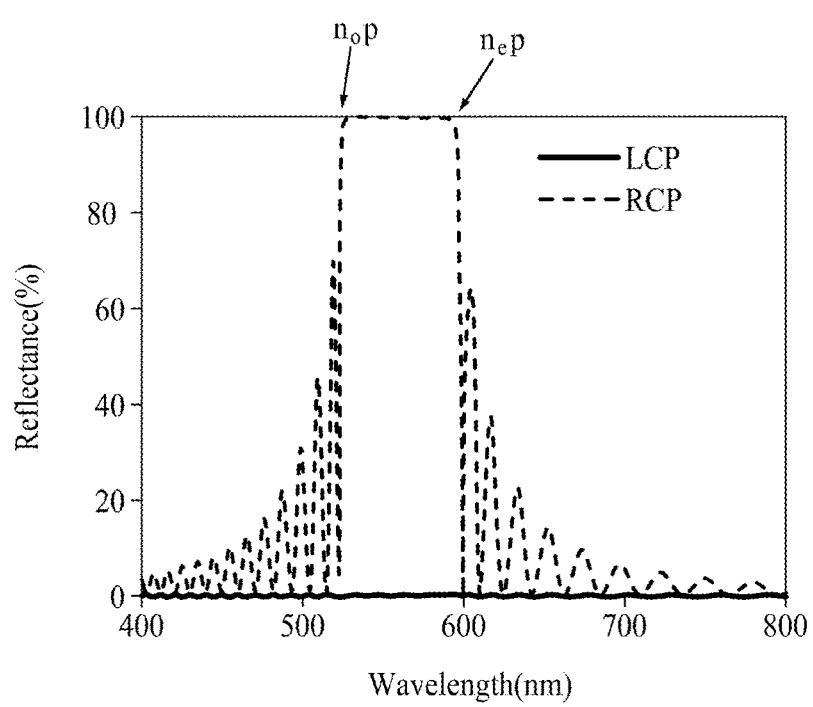
FIG. 9B illustrates a reflectance by each wavelength of a second lower liquid crystal layer.
Figure 10:
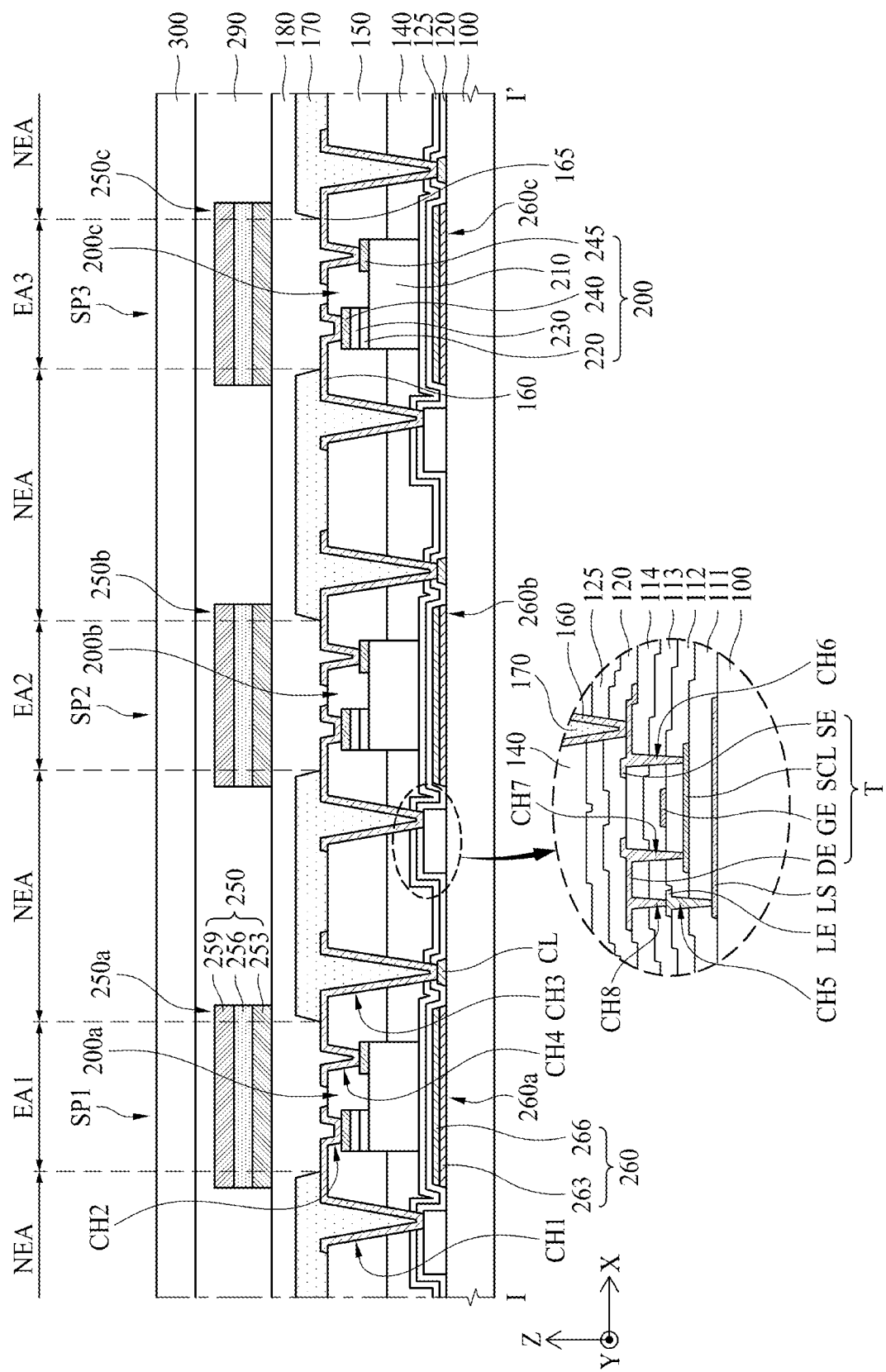
FIG. 10 is a cross sectional view illustrating another example along I-I' of FIG. 2.

FIG. 6 is a cross sectional view illustrating another example along I-I' of FIG. 2, FIG. 7 illustrates one example of randomly distributing liquid crystal molecules in a plurality of liquid crystal pattern areas in each of a first lower optical element, a second lower optical element and a third lower optical element, and FIG. 8 is a cross sectional view illustrating a structure of the first lower optical element, the second lower optical element and the third lower optical element. FIG. 9A illustrates a reflectance by each wavelength of a first lower liquid crystal layer, FIG. 9B illustrates a reflectance by each wavelength of a second lower liquid crystal layer, and FIG. 10 is a cross sectional view illustrating another example along I-I' of FIG. 2.

The lower optical element 260 may be provided between the light emitting diode 200 and the first substrate 100, as shown in FIG. 6. The lower optical element 260 may reflect and scatter the light emitted from the light emitting diode 200 by randomly distributing cholesteric liquid crystal. The lower optical element 260 may include a plurality of lower liquid crystal layers 263 and 266. For example, the lower optical element 260 may include a first lower liquid crystal layer 263 and a second lower liquid crystal layer 266.

The first lower liquid crystal layer 263 includes first cholesteric liquid crystal molecules 261 having a spiral structure rotating in a first rotation direction. The first cholesteric liquid crystal molecules 261 may reflect circularly polarized light in the same direction as the first rotation direction due to the spiral structure, and may transmit circularly polarized light in a direction opposite to the first rotation direction. For example, the first cholesteric liquid crystal molecules 261 may have the spiral structure rotating in the left direction. In this case, the first cholesteric liquid crystal molecules 261 may reflect left circularly polarized light LCP, as shown in FIG. 9A, and may transmit right circularly polarized light RCP. In this case, reflectance of the first cholesteric liquid crystal molecules 261 may be 100% in the left circularly polarized light LCP of a wavelength range from $n_oP$ to $n_eP$. The '$n_o$' represents a refractive index of a short axis of the first cholesteric liquid crystal molecules 261, 'P' represents a pitch length of the first cholesteric liquid crystal molecules 261, and '$n_e$' represents a refractive index of a long axis of the first cholesteric liquid crystal molecules 261. According as the difference between '$n_o$' representing the refractive index of the short axis of the first cholesteric liquid crystal molecules 261 and '$n_e$' representing the refractive index of the long axis of the first cholesteric liquid crystal molecules 261 becomes larger, the first cholesteric liquid crystal molecules 261 may have a wider wavelength band with reflectance of 100%.

The first cholesteric liquid crystal molecules 261 may be randomly distributed on the lower surface of the first lower liquid crystal layer 263. For example, as shown in FIG. 7, the first lower liquid crystal layer 263 may be divided into a plurality of liquid crystal pattern areas LPA2, and the first cholesteric liquid crystal molecules 261 may be randomly distributed in each of the plurality of divided liquid crystal pattern areas LPA2. The arrangement directions of the first cholesteric liquid crystal molecules 261 may be different for each liquid crystal pattern area LPA2. The plurality of first cholesteric liquid crystal molecules 261 may be disposed in each of the plurality of liquid crystal pattern areas LPA2, and the first cholesteric liquid crystal molecules 261 disposed in the same liquid crystal pattern area LPA2 may be aligned in the same direction. As shown in FIG. 8, the first lower liquid crystal layer 263 may be configured by stacking the first cholesteric liquid crystal molecules 261 being rotated in the first rotation direction with respect to each of the first cholesteric liquid crystal molecules 261 disposed on the lower surface.

The first lower liquid crystal layer 263 may fix the first cholesteric liquid crystal molecules 261 in an initial arrangement direction by using RM 262. The RM 262 is a photoreactive compound, which may be cured in response to light such as ultraviolet light UV. The first cholesteric liquid crystal molecules 261 may be fixed in the initial arrangement direction while the RM is cured.

The second lower liquid crystal layer 266 is provided on the first lower liquid crystal layer 263 and is configured to include second cholesteric liquid crystal molecules 264 having a spiral structure rotating in a second rotation direction. The second rotation direction may be an opposite direction to the first direction. The second cholesteric liquid crystal molecules 264 may reflect circularly polarized light in the same direction as the second rotation direction due to the spiral structure, and may transmit circularly polarized light in a direction opposite to the second rotation direction. For example, the second cholesteric liquid crystal molecules 264 may have a spiral structure rotating in the right direction. In this case, the second cholesteric liquid crystal molecules 264 may reflect the right circularly polarized RCP and may transmit the left circularly polarized LCP, as shown in FIG. 9B. In this case, reflectance of the second cholesteric liquid crystal molecules 264 may be 100% in the right circularly polarized light RCP of a wavelength range from $n_oP$ to $n_eP$. The '$n_o$' represents a refractive index of a short axis of the second cholesteric liquid crystal molecules 264, 'P' represents a pitch length of the second cholesteric liquid crystal molecules 264, and '$n_e$' represents a refractive index of a long axis of the second cholesteric liquid crystal molecules 264. According as the difference between '$n_o$' representing the refractive index of the short axis of the second cholesteric liquid crystal molecules 264 and '$n_e$' representing the refractive index of the long axis of the second cholesteric liquid crystal molecules 264 becomes larger, the second cholesteric liquid crystal molecules 264 may have a wider wavelength band with reflectance of 100%.

The second cholesteric liquid crystal molecules 264 may be randomly distributed on the lower surface of the second lower liquid crystal layer 266. The second lower liquid crystal layer 266 may be aligned along the alignment direction of the first cholesteric liquid crystal molecules 261 disposed on the uppermost layer of the first lower liquid crystal layer 263. Accordingly, the second cholesteric liquid crystal molecules 264 may be randomly distributed. The second lower liquid crystal layer 266 may be configured by stacking second cholesteric liquid crystal molecules 264 being rotated in the second rotation direction with respect to each of the second cholesteric liquid crystal molecules 264 disposed on the lower surface.

The second lower liquid crystal layer 266 may fix the second cholesteric liquid crystal molecules 264 in an initial arrangement direction by using RM 265. The RM 265 is a photoreactive compound which is cured in response to light such as ultraviolet light UV. The second cholesteric liquid crystal molecules 264 may be fixed in the initial arrangement direction while the RM 265 is cured.

The light emitting diode display device according to another embodiment of the present disclosure includes the lower optical element 260 including the first lower liquid crystal layer 263 and the second lower liquid crystal layer 266, thereby reflecting the light emitted from the light emitting diode 200 regardless of polarization. For example, among the light incident on the lower optical element 260 from the light emitting diode 200, the right circularly polarized light may be reflected by the second lower liquid crystal layer 266 and the optical path may be changed to the second substrate 300. Meanwhile, the left circularly polarized light of the light incident on the lower optical element 260 from the light emitting diode 200 passes through the second lower liquid crystal layer 266, but it may be reflected by the first lower liquid crystal layer 263 disposed under the second lower liquid crystal layer 266, to thereby change the optical path to the second substrate 300.

Also, in case of the light emitting diode display device according to another embodiment of the present disclosure, the cholesteric liquid crystal molecules are randomly distributed in the lower optical element 260, so that the light incident on the lower optical element 260 from the light emitting diode 200 may be reflected and scattered, at the same time. Accordingly, the light emitting diode display device according to another embodiment of the present disclosure may improve external light extraction efficiency by changing the path of light trapped in the lower portion of the light emitting diode 200.

According to one embodiment, a thickness d21 of the first lower liquid crystal layer 263 may be the same as a thickness d22 of the second lower liquid crystal layer 266, but not limited thereto. The lower optical element 260 has a thickness enabling a sufficient reflection of the incident light from the light emitting diode 200, for example, a thickness of 4~5 µm.

The lower optical element 260 may be patterned for each subpixel SP1, SP2, and SP3. Specifically, the lower optical element 260 may include a first lower optical element 260a provided in the first subpixel SP1, a second lower optical element 260b provided in the second subpixel SP2, and a third lower optical element 260c provided in the third subpixel SP3.

The first lower optical element 260a may be provided on the first light emitting diode 200a and may be configured to reflect and scatter the first light emitted from the first light emitting diode 200a. The first light may have a first peak wavelength. For example, the first light may be red light and its peak wavelength may be 625 nm. The first lower optical element 260a may have an area equal to or larger than that of the first light emitting area EA1 and may be disposed to overlap the first light emitting area EA1.

The second lower optical element 260b may be provided on the second light emitting diode 200b and may be configured to reflect and scatter the second light emitted from the second light emitting diode 200b. The second light may have a second peak wavelength shorter than the first peak wavelength. For example, the second light may be green light and its peak wavelength may be 530 nm. The second lower optical element 260b may have an area equal to or larger than that of the second light emitting area EA2 and may be disposed to overlap the second light emitting area EA2.

The third lower optical element 260c may be provided on the third light emitting diode 200c and may be configured to reflect and scatter the third light emitted from the third light emitting diode 200c. The third light may have a third peak wavelength shorter than the second peak wavelength. For example, the third light may be blue light and its peak wavelength may be 461 nm. The third lower optical element 260c may have an area equal to or larger than that of the third light emitting area EA3 and may be disposed to overlap the third light emitting area EA3.

The first lower optical element 260a, the second lower optical element 260b, and the third lower optical element 260c may be spaced apart from each other. Each of the first lower optical element 260a, the second lower optical element 260b, and the third lower optical element 260c may be formed in a film shape through a separate manufacturing process and then may be attached or deposited on the first substrate 100.

According to one embodiment, each of the first lower optical element 260a, the second lower optical element 260b, and the third lower optical element 260c may be formed in the form of a film through a manufacturing process consisting of a photo patterning process, a first spin coating process, a first polymerization process, a second spin coating process, a second polymerization process, and a removal process. These patterning process, spin coating process, polymerization process, and removal process uses the different material for the liquid crystal layer from that of the pattering process, the spin coating process, the polymerization process, and the removal process of the upper optical element 250. However, the patterning process, spin coating process, polymerization process, and removal process have the same processing as those of the pattering process, the spin coating process, the polymerization process, and the removal process of the upper optical element 250, whereby a detailed description thereof will be omitted.

The first lower optical element 260a may be attached or deposited on the first substrate 100 and may be configured to overlap the first light emitting area EA for emitting the first light emitted from the first light emitting diode 200a to the outside. The second lower optical element 260b may be attached to or deposited on the first substrate 100 and may be configured to overlap the second light emitting area EA2 for emitting the second light emitted from the second light emitting diode 200b to the outside. The third lower optical element 260c may be attached to or deposited on the first substrate 100 and may be configured to overlap the third light emitting area EA3 for emitting the third light emitted from the third light emitting diode 200c to the outside.

The first lower optical element 260a, the second lower optical element 260b, and the third lower optical element 260c are not formed as a single layer, and each of the first lower optical element 260a, the second lower optical element 260b, and the third lower optical element 260c may be manufactured in the form of film through a separate manufacturing process, and then attached to or deposited on the corresponding light emitting area EA1, EA2, and EA3.

The first lower optical element 260a, the second lower optical element 260b, and the third lower optical element 260c may be provided to cover the light emitting areas EA1, EA2, and EA3 having an area equal to or larger than the corresponding light emitting areas EA1, EA2, and EA3 so as to reflect and scatter the light. In this case, the first lower optical element 260a, the second lower optical element 260b, and the third lower optical element 260c need not cover up to a non-light emitting area NEA. Preferably, the first lower optical element 260a, the second lower optical element 260b, and the third lower optical element 260c do not have an excessively large area so as not to overlap another adjacent light emitting area due to errors of the attachment or deposition process. Accordingly, the first lower optical element 260a, the second lower optical element 260b, and the third lower optical element 260c may be not overlapped with each other and may be spaced apart from each other.

On the other hand, the first lower optical element 260a, the second lower optical clement 260b, and the third lower optical element 260c may have the same thickness D2a, D2b, and D2c.

Also, in case of the light emitting diode display device according to another embodiment of the present disclosure, the light incident on the first lower optical element 260a, the second lower optical element 260b, and the third lower optical element 260c may be diffused and reflected at the same angle.

Specifically, the first lower optical element 260a, the second lower optical element 260b, and the third lower optical element 260c may have different wavelength bands of incident light. Since the first lower optical element 260a, the second lower optical element 260b, and the third lower optical element 260c have different wavelength bands of incident light, the first lower optical element 260a, the second lower optical element 260b, and the third lower optical element 260c may have different diffusion angles with respect to incident light. In this case, it is difficult to realize an accurate color and image in the light emitting diode display device. To solve this problem, in case of the light emitting diode display device according to another embodiment of the present disclosure, the size of the liquid crystal pattern area LPA2 may be differently formed in each of the first lower optical element 260a, the second lower optical element 260b, and the third lower optical element 260c.

Referring to FIGS. 7 and 8, the first lower optical element 260a may be divided into a plurality of first liquid crystal pattern areas LPA2a, the second lower optical element 260b may be divided into a plurality of second liquid crystal pattern areas LPA2b, and the third lower optical element 260c may be divided into a plurality of third liquid crystal pattern areas LPA2c. Each of the first liquid crystal pattern area LPA2a, the second liquid crystal pattern area LPA2b, and the third liquid crystal pattern area LPA2c may represent a unit area in which liquid crystal molecules aligned in the same direction in each of the first lower optical element 260a, the second lower optical element 260b, and the third lower optical element 260c are disposed adjacent to each other.

The first liquid crystal pattern area LPA2a, the second liquid crystal pattern area LPA2b, and the third liquid crystal pattern area LPA2c may have different sizes from each other. The size of each of the first liquid crystal pattern area LPA2a, the second liquid crystal pattern area LPA2b, and the third liquid crystal pattern area LPA2c may be determined based on the incident wavelength band. In the light emitting diode display device according to another embodiment of the present disclosure, the size $S2a$ of the first liquid crystal pattern area LPA2a, the size $S2b$ of the second liquid crystal pattern area LPA2b, and the size $S2c$ of the third liquid crystal pattern area LPA2c may be determined to have the same diffusion angle based on the above Equation 1 in the first lower optical element 260a, the second lower optical element 260b, and the third lower optical clement 260c.

The size $S2a$ of the first liquid crystal pattern area LPA2a of the first lower optical clement 260a may be greater than the size S2*b* of the second liquid crystal pattern area LPA2*b* of the second lower optical element 260*b*. The first lower optical element 260*a* and the second lower optical element 260*b* may have the same size in formation area. In this case, the number of first liquid crystal pattern areas LPA2*a* may be smaller than the number of second liquid crystal pattern areas LPA2*b*.

On the other hand, the size S2*c* of the third liquid crystal pattern area LPA2*c* of the third lower optical element 260*c* may be smaller than the size S2*b* of the second liquid crystal pattern area LPA2*b* of the second lower optical element 260*b*. The second lower optical element 260*b* and the third lower optical element 260*c* may have the same size in formation area. In this case, the number of third liquid crystal pattern areas LPA2*c* may be larger than the number of second liquid crystal pattern areas LPA2*b*.

Herein, the size S2*a* of the first liquid crystal pattern area LPA2*a* may indicate the horizontal length or vertical length of the first liquid crystal pattern area LPA2*a*, the size S2*b* of the second liquid crystal pattern area LPA2*b* may indicate the horizontal length or vertical length of the second liquid crystal pattern area LPA2*b*, and the size S2*c* of the third liquid crystal pattern area LPA2*c* may indicate the horizontal length or vertical length of the third liquid crystal pattern area LPA2*c*.

The light emitting diode display device according to another embodiment of the present disclosure adjusts the sizes S2*a*, S2*b*, and S2*c* of the liquid crystal pattern areas LPA2*a*, LPA2*b*, and LPA2*c* of the first lower optical element 260*a*, the second lower optical element 260*b*, and the third lower optical element 260*c* so that the first lower optical element 260*a*, the second lower optical element 260*b*, and the third lower optical element 260*c* make the incident light be diffused and reflected at the same angle. Accordingly, the light emitting diode display device according to another embodiment of the present disclosure may scatter and diffuse the light by using the first lower optical element 260*a*, the second lower optical element 260*b*, and the third lower optical element 260*c*, and simultaneously implement accurate colors and images.

On the other hand, the light emitting diode display device according to another embodiment of the present disclosure may determine the pitch length of cholesteric liquid crystal molecules for each of the first lower optical element 260*a*, the second lower optical element 260*b*, and the third lower optical element 260*c* on the basis of the wavelength band of incident light. The first cholesteric liquid crystal molecules 261 and the second cholesteric liquid crystal molecules 264 may adjust the pitch length by adjusting an add amount of chiral dopant.

The wavelength of light reflected by the first cholesteric liquid crystal molecules 261 and the second cholesteric liquid crystal molecules 264 may be determined by the pitch length. The wavelength band of light close to 100% of reflectance may be proportional to the pitch length of the first cholesteric liquid crystal molecules 261 and the second cholesteric liquid crystal molecules 264. The wavelength band of light close to 100% of reflectance may be larger according as the pitch length of the first cholesteric liquid crystal molecules 261 and the second cholesteric liquid crystal molecules 264 increases more.

First, first light emitted from the first light emitting diode 200*a* and configured to have a first wavelength band may be incident on the first lower optical element 260*a*, and second light emitted from the second light emitting diode 200*b* and configured to have a second wavelength band shorter than the first wavelength band may be incident on the second lower optical element 200*b*. Since the wavelength of the light incident on the first lower optical element 260*a* is greater than the wavelength of the light incident on the second lower optical element 260*b*, the first pitch length Pa of the cholesteric liquid crystal molecules 261 and 264 provided in the first lower optical element 260*a* may be greater than the second pitch length Pb of the cholesteric liquid crystal molecules 261 and 264 provided in the second lower optical element 260*b*.

Also, third light emitted from the third light emitting diode 200*c* and configured to have a third wavelength band shorter than the second wavelength band may be incident on the third lower optical element 260*c*. Since the wavelength of the light incident on the second lower optical element 260*b* is greater than the wavelength of the light incident on the third lower optical element 260*c*, the second pitch length Pb of the cholesteric liquid crystal molecules 261 and 264 provided in the second lower optical element 260*b* may be greater than the third pitch length Pc of the cholesteric liquid crystal molecules 261 and 264 provided in the third lower optical element 260*c*.

Accordingly, the light emitting diode display device according to another embodiment of the present disclosure may have high reflectance in each of the first lower optical element 260*a*, the second lower optical element 260*b*, and the third lower optical element 260*c*.

The light emitting diode display device according to another embodiment of the present disclosure includes the lower optical element 260 under the light emitting diode 200 so that it is possible to reflect and scatter the light emitted downward from the light emitting diode 200, thereby improving the light extraction efficiency, the front luminance, and the luminance distribution for each viewing angle of the light emitting diode 200.

Also, in case of the light emitting diode display device according to another embodiment of the present disclosure, the light emitted downward from the light emitting diode 200 is scattered and diffused by the lower optical element 260. Thus, even when a transfer tolerance of the light emitting diode 200 occurs, it is possible to prevent the luminance distribution for each viewing angle from being biased to one side.

Also, in case of the light emitting diode display device according to another embodiment of the present disclosure, the lower optical element 260 is manufactured in the form of film through a separate manufacturing process so that it is possible to additionally provide the lower optical element 260 without any effects on the manufacturing process of the existing light emitting diode display device.

Also, in case of the light emitting diode display device according to another embodiment of the present disclosure, the lower optical element 260 is manufactured in a thin film form, and there is no need to secure an optical distance between the lower optical element 260 and the light emitting diode 200. Accordingly, the light emitting diode display device according to another embodiment of the present disclosure may have a simplified manufacturing process and a thin profile of device, as compared to a related art device using a lens.

Meanwhile, FIG. 3 shows that only the upper optical element 250 is provided on the light emitting diode 200, and FIG. 6 shows that only the lower optical element 260 is provided under the light emitting diode 200, but not limited thereto.

A light emitting diode display device according to another embodiment of the present disclosure may comprise an upper optical element 250 on a light emitting diode 200, as shown in FIG. 10, and a lower optical element 260 under the light emitting diode 200. In the light emitting diode display device according to another embodiment of the present disclosure, light emitted downward from the light emitting diode 200 is reflected or scattered by the lower optical element 260 and is then configured to have a changed light path in an upward direction. Accordingly, the light emitting diode display device according to another embodiment of the present disclosure may improve light extraction efficiency.

Also, in case of the light emitting diode display device according to another embodiment of the present disclosure, light emitted upward from the light emitting diode 200 and light reflected or scattered by the lower optical element 260 and proceeding upwardly may be scattered while being transmitted through the upper optical element 250. Accordingly, the light emitting diode display device according to another embodiment of the present disclosure may greatly improve the front luminance.

According to the present disclosure, the optical element is provided, in which the liquid crystal molecules are randomly distributed, so that it is possible to increase the front luminance, and to improve the luminance distribution for each inefficient viewing angle of the light emitting diode.

Also, the light emitted from the light emitting diode is scattered and diffused by the optical element in the light emitting diode display device according to the present disclosure. Thus, even if the transfer tolerance occurs, it is possible to prevent the luminance distribution for each viewing angle from being biased to one side.

Also, according to the present disclosure, the optical element is manufactured in the thin film form, and there is no need to secure the optical distance between the optical element and the light emitting diode, thereby simplifying the process and realizing the thin profile of the device.

In addition, since the optical elements provided in the respective subpixels have the same diffusion angle, it is possible to scatter and diffuse the light by the optical element and simultaneously to implement accurate colors and images.

It will be apparent to those skilled in the art that various substitutions, modifications, and variations are possible within the scope of the present disclosure without departing from the spirit and scope of the present disclosure. Therefore, all changes or modifications derived from the meaning, range and equivalent concept of the example embodiments described herein should be interpreted as being included in the scope of the present disclosure.

Note that the technical scope of the present disclosure also covers the following solutions.

Solution 1. A light emitting diode display device comprising:
   a light emitting diode over a substrate; and
   an optical element provided with liquid crystal molecule randomly distributed therein and configured to change a path of light emitted from the light emitting diode.

Solution 2. The light emitting diode display device according to Solution 1, wherein the optical element includes an upper optical element provided over the light emitting diode, configured to scatter the light emitted from the light emitting diode, and configured to include a plurality of upper liquid crystal layers.

Solution 3. The light emitting diode display device according to Solution 2, wherein the plurality of upper liquid crystal layers include:
   a first upper liquid crystal layer including first liquid crystal molecules twisted in a first direction; and
   a second upper liquid crystal layer provided over the first upper liquid crystal layer and configured to include second liquid crystal molecules twisted in a second direction opposite to the first direction.

Solution 4. The light emitting diode display device according to Solution 3, wherein the first upper liquid crystal layer and the second upper liquid crystal layer include chiral dopant.

Solution 5. The light emitting diode display device according to Solution 3, wherein the plurality of upper liquid crystal layers further include a third upper liquid crystal layer provided between the first upper liquid crystal layer and the second upper liquid crystal layer and configured to include third liquid crystal molecules having a twist angle smaller than '1'.

Solution 6. The light emitting diode display device according to Solution 5, wherein the first liquid crystal molecules, the second liquid crystal molecules, and the third liquid crystal molecules are nematic liquid crystal.

Solution 7. The light emitting diode display device according to Solution 2,
   wherein the light emitting diode includes a first light emitting diode for emitting first light having a first peak wavelength and a second light emitting diode for emitting second light having a second peak wavelength shorter than the first peak wavelength,
   the upper optical element includes a first upper optical element provided over the first light emitting diode and a second upper optical element provided over the second light emitting diode, and
   the first upper optical element and the second upper optical element are spaced apart from each other.

Solution 8. The light emitting diode display device according to Solution 7,
   wherein the first upper optical element is divided into a plurality of first liquid crystal pattern areas, and the second upper optical element is divided into a plurality of second liquid crystal pattern areas, and
   the size of the first liquid crystal pattern areas is different from the size of the second liquid crystal pattern areas.

Solution 9. The light emitting diode display device according to Solution 8, wherein the size of each of the first liquid crystal pattern areas is greater than the size of each of the second liquid crystal pattern areas.

Solution 10. The light emitting diode display device according to Solution 8, wherein the number of the first liquid crystal pattern areas is smaller than the number of the second liquid crystal pattern areas.

Solution 11. The light emitting diode display device according to Solution 7, wherein the first upper optical element has the same light diffusion angle as that of the second upper optical element.

Solution 12. The light emitting diode display device according to Solution 2, further comprising a bank including an opening area corresponding to a light emitting area in which light emitted from the light emitting diode is emitted to the outside,
   wherein the upper optical element is provided over the bank, and is configured to have an area equal to or larger than that of the light emitting area and is disposed to at least partially overlap the light emitting area.

Solution 13. The light emitting diode display device according to Solution 12, wherein the bank includes a light absorbing material.

Solution 14. The light emitting diode display device according to Solution 1, wherein the optical element comprises a lower optical element provided between the substrate and the light emitting diode to scatter or reflect the light emitted from the light emitting diode and configured to include a plurality of lower liquid crystal layers in which cholesteric liquid crystal molecules are disposed.

Solution 15. The light emitting diode display device according to Solution 14, wherein the plurality of lower liquid crystal layers include:
- a first lower liquid crystal layer including first cholesteric liquid crystal molecules having a spiral structure rotating in a first rotation direction; and
- a second lower liquid crystal layer provided on the first lower liquid crystal layer and configured to include second cholesteric liquid crystal molecules having a spiral structure rotating in a second rotation direction opposite to the first rotation direction.

Solution 16. The light emitting diode display device according to Solution 14,
- wherein the light emitting diode includes a first light emitting diode for emitting first light having a first peak wavelength and a second light emitting diode for emitting second light having a second peak wavelength shorter than the first peak wavelength,
- the lower optical element includes a first lower optical element provided between the substrate and the first light emitting diode, and a second lower optical element provided between the substrate and the second light emitting diode, and
- the first lower optical element and the second lower optical element are spaced apart from each other.

Solution 17. The light emitting diode display device according to Solution 16, wherein cholesteric liquid crystal molecules provided in the first lower optical element have a first pitch length, and cholesteric liquid crystal molecules provided in the second lower optical element have a second pitch length smaller than the first pitch length.

Solution 18. The light emitting diode display device according to Solution 1, wherein the light emitting diode comprises:
- a first semiconductor layer;
- an active layer provided over one side of the first semiconductor layer;
- a second semiconductor layer provided over the active layer;
- a first electrode provided over the second semiconductor layer; and
- a second electrode provided over the other side of the first semiconductor layer.

Solution 19. A light emitting diode display device comprising:
- a light emitting diode over a substrate; an upper optical element provided with liquid crystal molecule randomly distributed therein and provided over the light emitting diode;
- a lower optical element provided with liquid crystal molecule randomly distributed therein and provided between the substrate and the light emitting diode, wherein light emitted downward from the light emitting diode is reflected or scattered by the lower optical element and has a changed light path in an upward direction,
- wherein light emitted upward from the light emitting diode and the light reflected or scattered by the lower optical element and proceeding upwardly are scattered while being transmitted through the upper optical element.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting diode display device comprising:
a light emitting diode over a substrate; and
an optical element including a liquid crystal molecule randomly distributed therein and configured to change a path of light emitted from the light emitting diode,
wherein the optical element includes an upper optical element provided over the light emitting diode, configured to scatter the light emitted from the light emitting diode, and configured to include a plurality of upper liquid crystal layers,
wherein the light emitting diode includes a first light emitting diode for emitting first light having a first peak wavelength and a second light emitting diode for emitting second light having a second peak wavelength shorter than the first peak wavelength,
the upper optical element includes a first upper optical element provided over the first light emitting diode and a second upper optical element provided over the second light emitting diode, and
the first upper optical element and the second upper optical element are spaced apart from each other.

2. The light emitting diode display device according to claim 1, wherein the plurality of upper liquid crystal layers include:
a first upper liquid crystal layer including first liquid crystal molecules twisted in a first direction; and
a second upper liquid crystal layer provided over the first upper liquid crystal layer and including a second liquid crystal molecules twisted in a second direction opposite to the first direction.

3. The light emitting diode display device according to claim 2, wherein the first upper liquid crystal layer and the second upper liquid crystal layer include chiral dopant.

4. The light emitting diode display device according to claim 2, wherein the plurality of upper liquid crystal layers further include a third upper liquid crystal layer provided between the first upper liquid crystal layer and the second upper liquid crystal layer and including a third liquid crystal molecules having a twist angle smaller than 1 degree.

5. The light emitting diode display device according to claim 4, wherein the first liquid crystal molecules, the second liquid crystal molecules, and the third liquid crystal molecules are nematic liquid crystal.

6. The light emitting diode display device according to claim 1,
wherein the first upper optical element is divided into a plurality of first liquid crystal pattern areas, and the second upper optical element is divided into a plurality of second liquid crystal pattern areas, and a size of each of the first liquid crystal pattern areas is different from a size of each of the second liquid crystal pattern areas.

7. The light emitting diode display device according to claim 6, wherein the size of each of the first liquid crystal pattern areas is greater than the size of each of the second liquid crystal pattern areas.

8. The light emitting diode display device according to claim 6, wherein a number of the first liquid crystal pattern areas is smaller than a number of the second liquid crystal pattern areas.

9. The light emitting diode display device according to claim 1, wherein the first upper optical element has a same light diffusion angle as that of the second upper optical element.

10. The light emitting diode display device according to claim 1, further comprising a bank including an opening area corresponding to a light emitting area through which light emitted from the light emitting diode is emitted to outside, wherein the upper optical element is provided over the bank, and has an area equal to or larger than that of the light emitting area and is disposed to at least partially overlap the light emitting area.

11. The light emitting diode display device according to claim 10, wherein the bank includes a light absorbing material.

12. A light emitting diode display device, comprising:
a light emitting diode over a substrate; and
an optical element including a liquid crystal molecule randomly distributed therein and configured to change a path of light emitted from the light emitting diode,
wherein the optical element comprises a lower optical element provided between the substrate and the light emitting diode to scatter or reflect the light emitted from the light emitting diode and including a plurality of lower liquid crystal layers in which cholesteric liquid crystal molecules are disposed,
wherein the light emitting diode includes a first light emitting diode for emitting first light having a first peak wavelength and a second light emitting diode for emitting second light having a second peak wavelength shorter than the first peak wavelength,
the lower optical element includes a first lower optical element provided between the substrate and the first light emitting diode, and a second lower optical element provided between the substrate and the second light emitting diode, and
the first lower optical element and the second lower optical element are spaced apart from each other.

13. The light emitting diode display device according to claim 12, wherein the plurality of lower liquid crystal layers include:
a first lower liquid crystal layer including first cholesteric liquid crystal molecules having a spiral structure rotating in a first rotation direction; and
a second lower liquid crystal layer provided on the first lower liquid crystal layer and including a second cholesteric liquid crystal molecules having a spiral structure rotating in a second rotation direction opposite to the first rotation direction.

14. The light emitting diode display device according to claim 12, wherein cholesteric liquid crystal molecules provided in the first lower optical element have a first pitch length, and cholesteric liquid crystal molecules provided in the second lower optical element have a second pitch length smaller than the first pitch length.

15. The light emitting diode display device according to claim 1, wherein the light emitting diode comprises:
a first semiconductor layer;
an active layer provided over one side of the first semiconductor layer;
a second semiconductor layer provided over the active layer;
a first electrode provided over the second semiconductor layer; and
a second electrode provided over the other side of the first semiconductor layer.

16. A light emitting diode display device comprising:
a light emitting diode over a substrate;
an upper optical element provided with liquid crystal molecule randomly distributed therein and provided over the light emitting diode; and
a lower optical element provided with liquid crystal molecule randomly distributed therein and provided between the substrate and the light emitting diode,
wherein in operation, light emitted downward from the light emitting diode is reflected or scattered by the lower optical element and has a changed light path in an upward direction,
wherein in operation, light emitted upward from the light emitting diode and the light reflected or scattered by the lower optical element upwardly are scattered while being transmitted through the upper optical element,
wherein the light emitting diode includes a first light emitting diode for emitting first light having a first peak wavelength and a second light emitting diode for emitting second light having a second peak wavelength shorter than the first peak wavelength,
the upper optical element includes a first upper optical element provided over the first light emitting diode and a second upper optical element provided over the second light emitting diode,
the lower optical element includes a first lower optical element provided between the substrate and the first light emitting diode, and a second lower optical element provided between the substrate and the second light emitting diode,
the first upper optical element and the second upper optical element are spaced apart from each other and
the first lower optical element and the second lower optical element are spaced apart from each other.

17. A light emitting diode display device comprising:
a first light emitting diode and a second light emitting diode over a substrate; and
an optical element including liquid crystal molecules randomly distributed therein, the optical element including a first optical element over the first light emitting diode and a second optical element over the second light emitting diode, the first optical element including a plurality of first liquid crystal pattern areas, the second optical element including a plurality of second liquid crystal pattern areas, and a size of each of the first liquid crystal pattern areas being different from a size of each of the second liquid crystal pattern areas.

* * * * *